United States Patent
Ohkubo et al.

(10) Patent No.: US 10,693,440 B2
(45) Date of Patent: Jun. 23, 2020

(54) ACOUSTIC WAVE DEVICE

(71) Applicant: TAIYO YUDEN CO., LTD., Tokyo (JP)

(72) Inventors: Satoru Ohkubo, Tokyo (JP); Kazuyuki Imagawa, Tokyo (JP); Ryo Miyamoto, Tokyo (JP)

(73) Assignee: TAIYO YUDEN CO., LTD., Tokyo (JP)

(*) Notice: Subject to any disclaimer, the term of this patent is extended or adjusted under 35 U.S.C. 154(b) by 90 days.

(21) Appl. No.: 15/985,949

(22) Filed: May 22, 2018

(65) Prior Publication Data
US 2018/0358951 A1 Dec. 13, 2018

(30) Foreign Application Priority Data
Jun. 13, 2017 (JP) .................. 2017-116180

(51) Int. Cl.
*H03H 9/25* (2006.01)
*H03H 9/02* (2006.01)
*H03H 9/05* (2006.01)

(52) U.S. Cl.
CPC .......... *H03H 9/25* (2013.01); *H03H 9/02244* (2013.01); *H03H 9/02448* (2013.01); *H03H 9/02834* (2013.01); *H03H 9/0552* (2013.01); *H03H 9/0571* (2013.01); *H03H 9/0576* (2013.01)

(58) Field of Classification Search
CPC .... H03H 9/25; H03H 9/0576; H03H 9/02244; H03H 9/0571; H03H 9/0552; H03H 9/02834; H03H 9/02448

USPC .......................... 333/133, 187, 188, 193–196
See application file for complete search history.

(56) References Cited

U.S. PATENT DOCUMENTS

| 6,351,194 B2* | 2/2002 | Takahashi ............ H03H 9/0576 174/262 |
| 2004/0227587 A1* | 11/2004 | Inoue ..................... H03H 9/605 333/133 |
| 2009/0302970 A1* | 12/2009 | Hatano ................ H03H 9/0571 333/133 |

(Continued)

FOREIGN PATENT DOCUMENTS

| JP | 2013-98804 A | 5/2013 |
| WO | 2012/144036 A1 | 10/2012 |

*Primary Examiner* — Robert J Pascal
*Assistant Examiner* — Jorge L Salazar, Jr.
(74) *Attorney, Agent, or Firm* — Chen Yoshimura LLP

(57) ABSTRACT

An acoustic wave device includes: a first substrate having a first surface on which an acoustic wave element is located; a second substrate having a second surface on which a functional element is located; a third substrate having a third surface, which faces the first and second surfaces, and a fourth surface being opposite to the third surface, a first metal layer separated from the acoustic wave element and a wiring line in the first substrate and connecting the first and third surfaces; a second metal layer separated from the functional element and a wiring line in the second substrate and connecting the second and third surfaces; a first metal pattern located on the third surface, being in contact with the first and second metal layers, and connecting the first and second metal layers; and a terminal located on the fourth surface and electrically connectable to the first metal pattern.

19 Claims, 17 Drawing Sheets

(56) References Cited

U.S. PATENT DOCUMENTS

2013/0002371 A1    1/2013   Ono
2013/0106530 A1    5/2013   Tajima et al.

\* cited by examiner

ACOUSTIC WAVE DEVICE

CROSS-REFERENCE TO RELATED APPLICATION

This application is based upon and claims the benefit of priority of the prior Japanese Patent Application No. 2017-116180, filed on Jun. 13, 2017, the entire contents of which are incorporated herein by reference.

FIELD

A certain aspect of the present invention relates to an acoustic wave device.

BACKGROUND

There has been known, as a method of packaging an acoustic wave device, a method that flip-chip mounts a chip, on which an acoustic wave element is formed, on the upper surface of a substrate by using a metal layer such as a bump. It has been known to release heat generated in the acoustic wave element through a metal pattern formed on a multi-layered substrate as disclosed in, for example, Japanese Patent Application Publication No. 2013-98804.

SUMMARY OF THE INVENTION

According to a first aspect of the present invention, there is provided an acoustic wave device including: a first substrate having a first surface; an acoustic wave element located on the first surface; a second substrate having a second surface; a functional element located on the second surface; a third substrate having a third surface and a fourth surface, the third surface facing the first surface and the second surface across an air gap, the fourth surface being an opposite surface of the third substrate from the third surface; a first metal layer that is separated from the acoustic wave element and a wiring line connected to the acoustic wave element in the first substrate and connects the first surface and the third surface; a second metal layer that is separated from the functional element and a wiring line connected to the functional element in the second substrate and connects the second surface and the third surface; a first metal pattern that is located on the third surface, is in contact with the first metal layer and the second metal layer, and connects the first metal layer and the second metal layer; and a terminal that is located on the fourth surface and is electrically connectable to the first metal pattern.

According to a second aspect of the present invention, there is provided an acoustic wave device including: a first substrate having a first surface; one or more first acoustic wave resonators located on the first surface and included in a first filter; one or more second acoustic wave resonators located on the first surface and included in a second filter having a passband different from a passband of the first filter; a second substrate having a second surface and a third surface, the second surface facing the first surface across an air gap, the third surface being an opposite surface of the second substrate from the second surface; a first metal layer that is separated from the one or more first acoustic wave resonators, the one or more second acoustic wave resonators, a wiring line connected to the one or more first acoustic wave resonators, and a wiring line connected to the one or more second acoustic wave resonators in the first substrate and connects the first surface and the second surface, an acoustic wave resonator closest to the first metal layer in plan view being at least one of the one or more first acoustic wave resonators; a second metal layer that is separated from the one or more first acoustic wave resonators, the one or more second acoustic wave resonators, the wiring line connected to the one or more first acoustic wave resonators, and the wiring line connected to the one or more second acoustic wave resonators in the first substrate and connects the first surface and the second surface, an acoustic wave resonator closest to the second metal layer in plan view being at least one of the one or more second acoustic wave resonators; a first metal pattern that is located on the second surface, is in contact with the first metal layer and the second metal layer, and connects the first metal layer and the second metal layer; and a terminal that is located on the third surface and is electrically connectable to the first metal pattern.

DETAILED DESCRIPTION

However, it is difficult to efficiently release heat generated in the acoustic wave element.

Hereinafter, a description will be given of embodiments with reference to the accompanying drawings.

First Embodiment

Figure 1A:
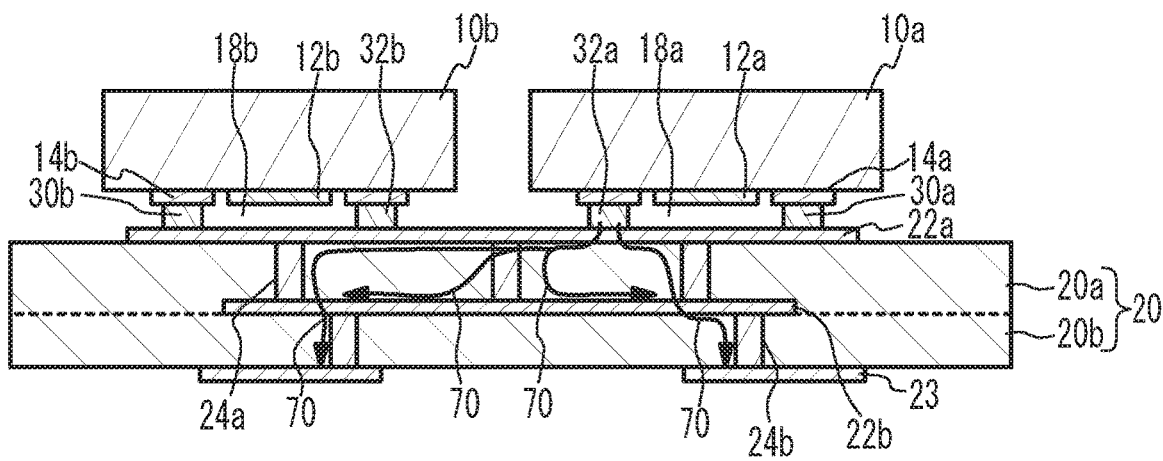
FIG. 1A and FIG. 1B are cross-sectional views of acoustic wave devices in accordance with a first embodiment and a first comparative example, respectively.
Figure 1B:
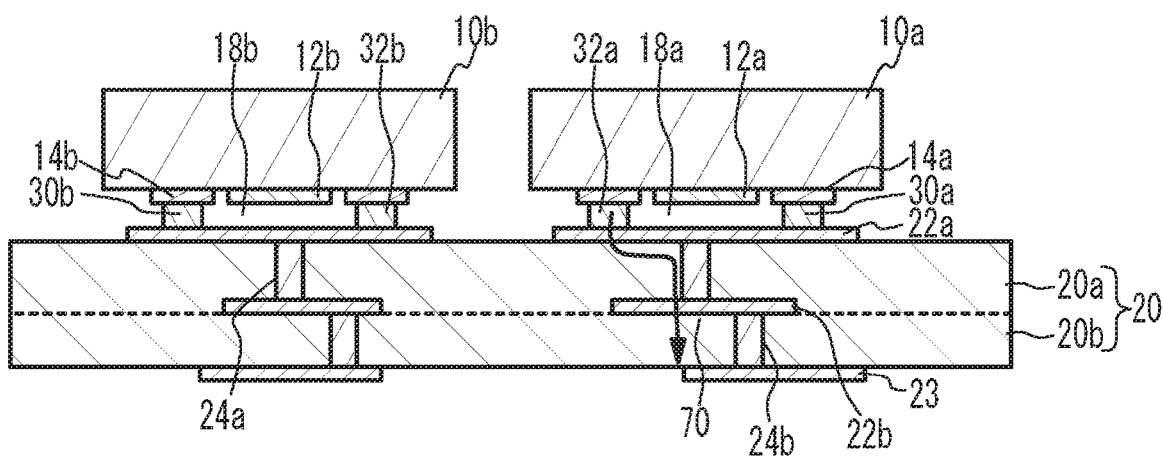

FIG. 1A and FIG. 1B are cross-sectional views of acoustic wave devices in accordance with a first embodiment and a first comparative example, respectively. As illustrated in FIG. 1A and FIG. 1B, in the first embodiment and the first comparative example, a substrate 20 (a third substrate) includes insulating layers 20a and 20b. A metal pattern 22a is located on the upper surface (a third surface) of the substrate 20, and a metal pattern 22b is located on the upper surface (a fifth surface) of the insulating layer 20b. Via wirings 24a and 24b respectively penetrating through the insulating layers 20a and 20b are provided. Terminals 23 are located on the lower surface (a fourth surface) of the substrate 20. The insulating layers 20a and 20b are ceramic layers made of High Temperature Co-Fired Ceramic (HTCC) or Low Temperature Co-Fired Ceramic (LTCC) or resin layers. The substrate 20 may have a single insulating layer or three or more insulating layers. The metal patterns 22a and 22b, the via wirings 24a and 24b, and the terminals 23 are formed of metal layers such as copper layers, gold layers, or tungsten layers.

An acoustic wave element 12a (a first acoustic wave element) and metal patterns 14a are located on the lower surface (a first surface) of a substrate 10a (a first substrate). An acoustic wave element 12b (a second acoustic wave element) and metal patterns 14b are located on the lower surface (a second surface) of a substrate 10b (a second substrate). The lower surface of the substrate 10a faces the upper surface of the substrate 20 across an air gap 18a, and the lower surface of the substrate 10b faces the upper surface of the substrate 20 across an air gap 18b. The metal patterns 14a and 14b are wiring lines electrically connecting the acoustic wave elements or the acoustic wave element and a pad, and are formed of a metal layer such as, for example, a copper layer, a gold layer, or an aluminum layer. The substrates 10a and 10b are flip-chip mounted on the upper surface of the substrate 20. The acoustic wave element 12a faces the upper surface of the substrate 20 across the air gap 18a, and the acoustic wave element 12b faces the upper surface of the substrate 20 across the air gap 18b.

A bump 30a and a dummy bump 32a are bonded to the metal patterns 14a and 22a, and connect the upper surface of the substrate 20 and the lower surface of the substrate 10a. A bump 30b and a dummy bump 32b are bonded to the metal patterns 14b and 22a, and connect the upper surface of the substrate 20 and the lower surface of the substrate 10b. The bump 30a is electrically connected to the acoustic wave element 12a through the metal pattern 14a, and the bump 30b is electrically connected to the acoustic wave element 12b through the metal pattern 14b. The dummy bump 32a (a first metal layer) is not electrically connected to the acoustic wave element 12a and is electrically independent in the substrate 10a, and the dummy bump 32b (a second metal layer) is not electrically connected to the acoustic wave element 12b and is electrically independent in the substrate 10b. The bumps 30a and 30b and the dummy bumps 32a and 32b are ground bumps. The bumps 30a and 30b and the dummy bumps 32a and 32b are, for example, gold bumps, solder bumps, or copper bumps.

Figure 2A:
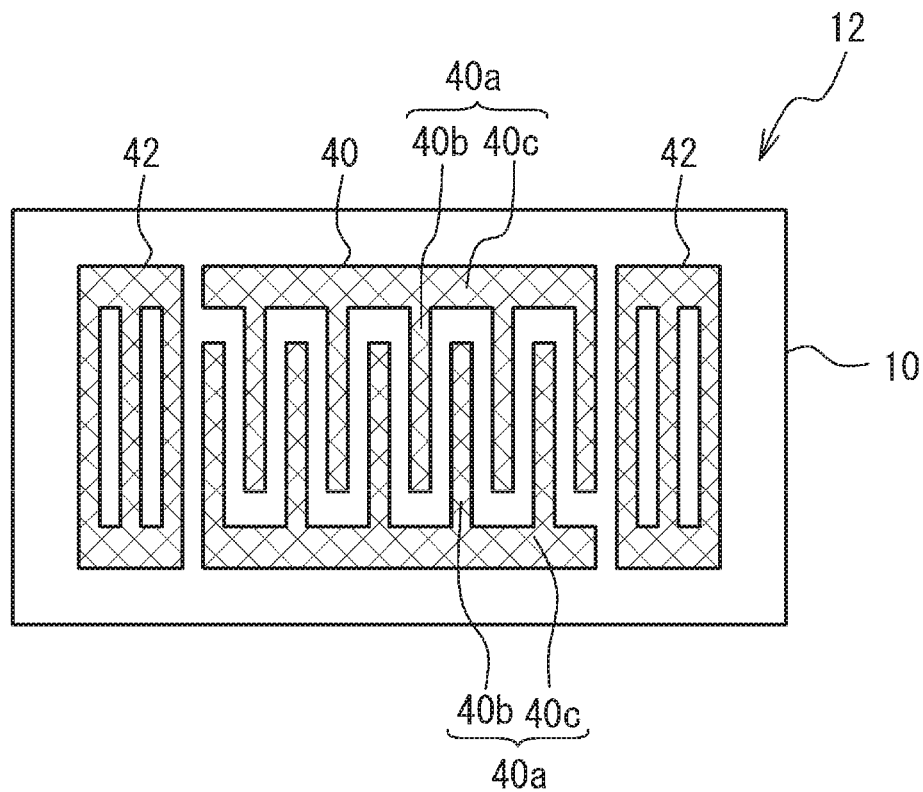
FIG. 2A and FIG. 2B are a plan view and a cross-sectional view of examples of an acoustic wave element in the first embodiment, respectively.
Figure 2B:
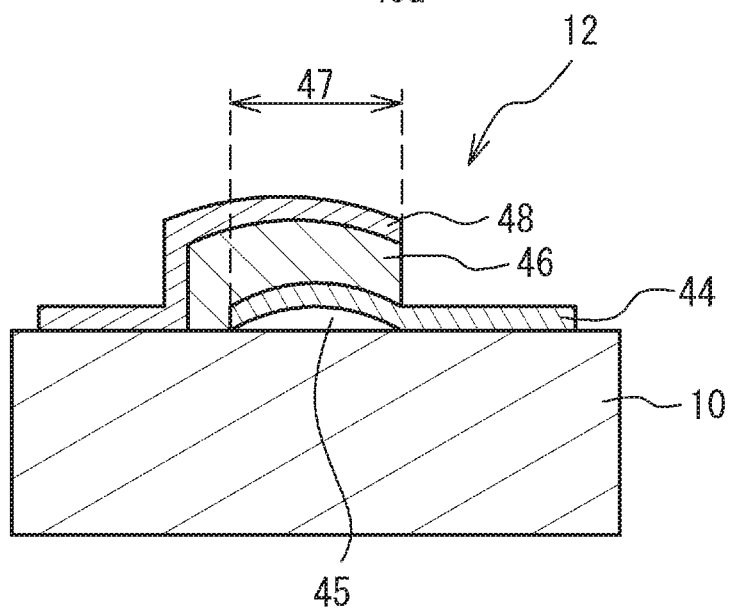

FIG. 2A and FIG. 2B are a plan view and a cross-sectional view of examples of the acoustic wave element in the first embodiment, respectively. As illustrated in FIG. 2A, an acoustic wave element 12 is a surface acoustic wave resonator, and corresponds to the acoustic wave elements 12a and 12b. The substrate 10 corresponds to the substrates 10a and 10b. The substrate 10 is a piezoelectric substrate such as a lithium tantalate substrate or a lithium niobate substrate. An Interdigital Transducer (IDT) 40 and reflectors 42 are located on the lower surface of the substrate 10. The IDT 40 has a pair of comb-shaped electrodes 40a facing each other. The comb-shaped electrode 40a includes electrode fingers 40b and a bus bar 40c connecting the electrode fingers 40b. The reflectors 42 are located at both sides of the IDT 40. The IDT 40 excites a surface acoustic wave on the substrate 10. The IDT 40 and the reflectors 42 are formed of, for example, an aluminum film or a copper film. A protective film or a temperature compensation film may be located on the substrate 10 so as to cover the IDT 40 and the reflectors 42.

As illustrated in FIG. 2B, the acoustic wave element 12 is a piezoelectric thin film resonator, and corresponds to the acoustic wave elements 12a and 12b. The substrate 10 corresponds to the substrates 10a and 10b. A piezoelectric film 46 is located on the substrate 10. A lower electrode 44 and an upper electrode 48 are located so as to sandwich the piezoelectric film 46. An air gap 45 is formed between the lower electrode 44 and the substrate 10. The region where the lower electrode 44 and the upper electrode 48 face each other across at least a part of the piezoelectric film 46 is a resonance region 47. The lower electrode 44 and the upper electrode 48 within the resonance region 47 excite the acoustic wave in the thickness extension mode in the piezoelectric film 46. The lower electrode 44 and the upper electrode 48 are formed of a metal film such as, for example, a ruthenium film. The piezoelectric film 46 is, for example, an aluminum nitride film.

The acoustic wave element 12 includes an electrode exciting the acoustic wave. Thus, the acoustic wave elements 12 are covered with the air gaps 18a and 18b so that the excitation of the acoustic wave is not restrained.

Description of Heat Release Efficiency

The bumps 30a and 30b are bumps electrically connected to the acoustic wave elements 12a and 12b. The dummy bumps 32a and 32b are bumps that are not electrically connected to the acoustic wave element 12a or 12b and are used to secure the mechanical strength. That is, the dummy bump 32a is electrically separated from the acoustic wave element 12a and the metal pattern 14a (a wiring line) electrically connected to the acoustic wave element 12a in the substrate 10a, and the dummy bump 32b is electrically separated from the acoustic wave element 12b and the metal pattern 14b (a wiring line) electrically connected to the acoustic wave element 12b in the substrate 10b. The arrangement of the bump 30a and the bump 30b is determined so that the electric characteristics of the acoustic wave elements 12a and 12b are secured. On the other hand, the dummy bumps 32a and 32b hardly affect the electric characteristics. Thus, it was examined to release heat generated in the acoustic wave element 12a through the dummy bump 32a. Here, it is assumed that the acoustic wave element 12a generates more heat than the acoustic wave element 12b. In this case, the amount of heat released from the dummy bump 32b is small. Thus, it is important to improve the efficiency of heat release from the dummy bump 32a.

As illustrated in FIG. 1B, in the first comparative example, the ground bump 30a and the dummy bump 32a of the substrate 10a are bonded to the same metal pattern 22a. The metal pattern 22a is connected to the metal pattern 22b through the via wiring 24a, and the metal pattern 22b is electrically connected to the terminal 23. The metal patterns 22a and 22b are provided for each of the substrates 10a and 10b. Thus, the heat release route from the dummy bump 32a is a single route as indicated by an arrow 70. Thus, the heat is not efficiently released.

As illustrated in FIG. 1A, in the first embodiment, the ground bump 30a and the dummy bump 32a of the substrate 10a and the ground bump 30b and the dummy bump 32b of the substrate 10b are bonded to the same metal pattern 22a. The metal pattern 22a is connected to the metal pattern 22b through a plurality of the via wirings 24a, and the metal pattern 22b is electrically connected to a plurality of the terminals 23. Thus, the heat release route from the dummy bump 32a is formed of parallel routes as indicated by the arrows 70. Accordingly, the heat release efficiency is improved.

In the first embodiment, the dummy bumps 32a and 32b are bonded to the same metal pattern 22a on the upper surface of the substrate 20. This structure allows the metal pattern 22a to be expanded to the area below the substrate 10b. Accordingly, an increased area of the metal pattern to which the dummy bump 32a is bonded is achieved. Therefore, the efficiency of heat release from the dummy bump 32a is improved.

Simulation

By using samples A through D, heat release characteristics and high-frequency characteristics of the first embodiment and the first comparative example were simulated. The sample A corresponds to the first comparative example, and the samples B through D correspond to the first embodiment.

Figure 3:
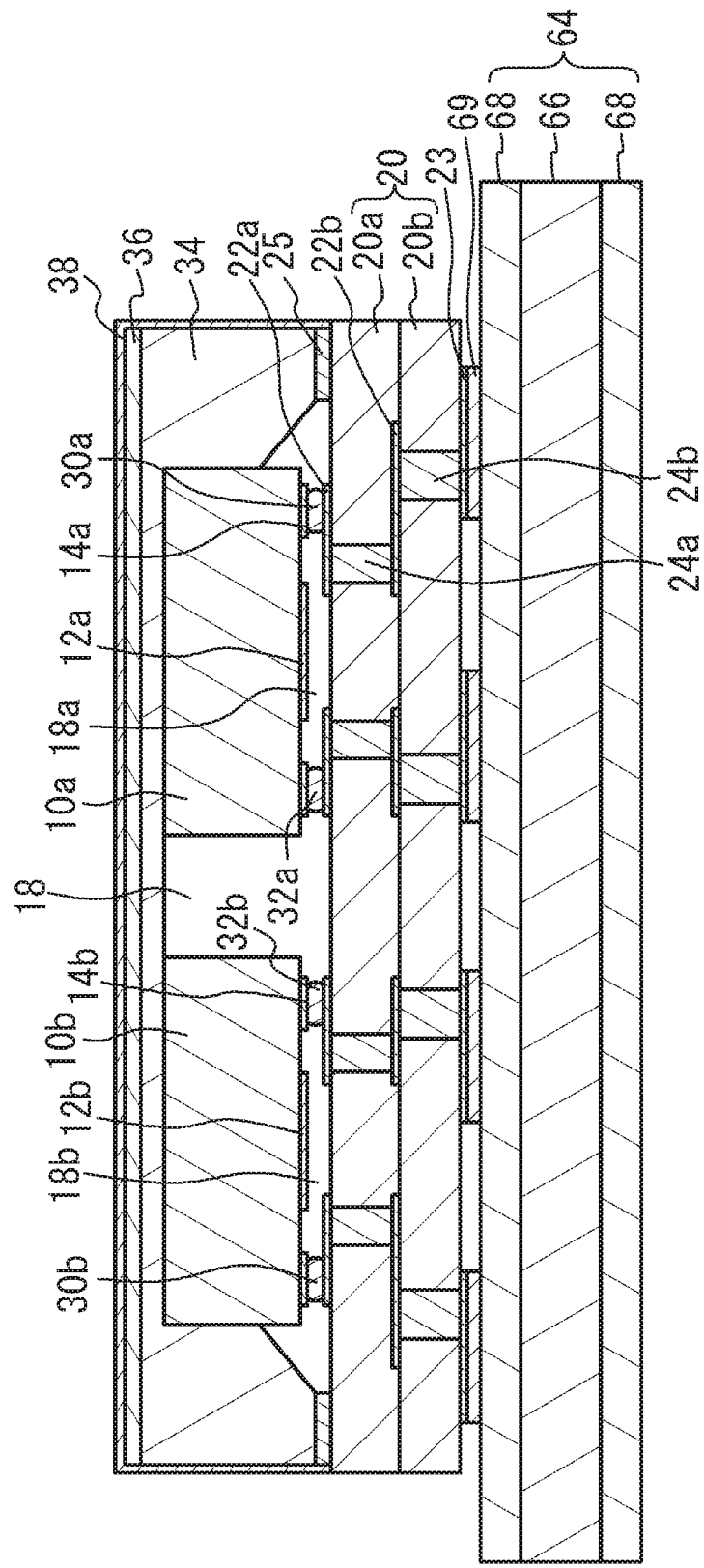
FIG. 3 is a cross-sectional view of the acoustic wave device used for a simulation.

FIG. 3 is a cross-sectional view of the acoustic wave device used for the simulation. A sealing portion 34 is located so as to surround the substrates 10a and 10b. The sealing portion 34 is bonded to the upper surface of a ring-shaped metal layer 25. The ring-shaped metal layer 25 is, for example, a copper layer, a gold layer, or a tungsten layer. The air gap 18a is located between the lower surface of the substrate 10a and the upper surface of the substrate 20, and the air gap 18b is located between the lower surface of the substrate 10b and the upper surface of the substrate 20. An air gap 18 is located between the substrates 10a and 10b. The sealing portion 34 is formed of, for example, a metal layer such as a solder layer or a resin layer. A plate-like lid 36 is located on the sealing portion 34. The lid 36 is, for example, a metal plate of kovar or an insulating plate. A protective film 38 is located so as to cover the lid 36 and the sealing portion 34. The protective film 38 is, for example, a metal film such as a nickel film or an insulating film.

In the simulation, the acoustic wave device is mounted on a mounting board 64. The mounting board 64 includes metal layers 68 sandwiching a resin substrate 66. The terminals 23 are bonded on the metal layer 68 through solder 69.

Figure 4A:
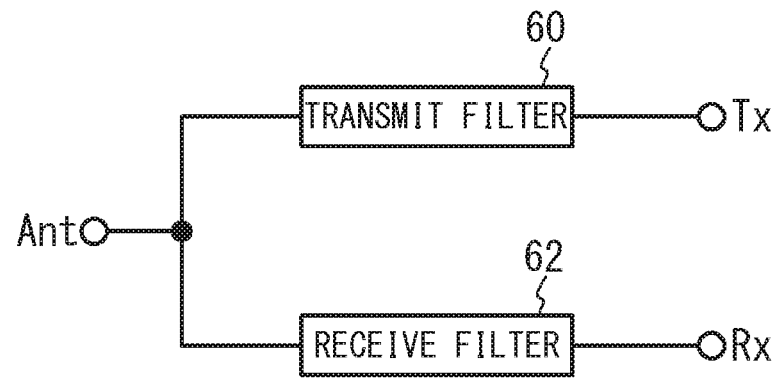
FIG. 4A is a circuit diagram of the duplexer used for the simulation.
Figure 4B:
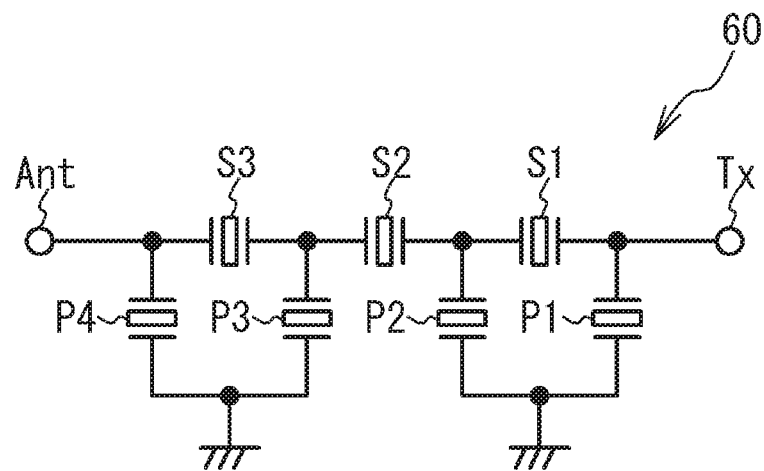
FIG. 4B and FIG. 4C are circuit diagrams of a transmit filter and a receive filter, respectively.
Figure 4C:
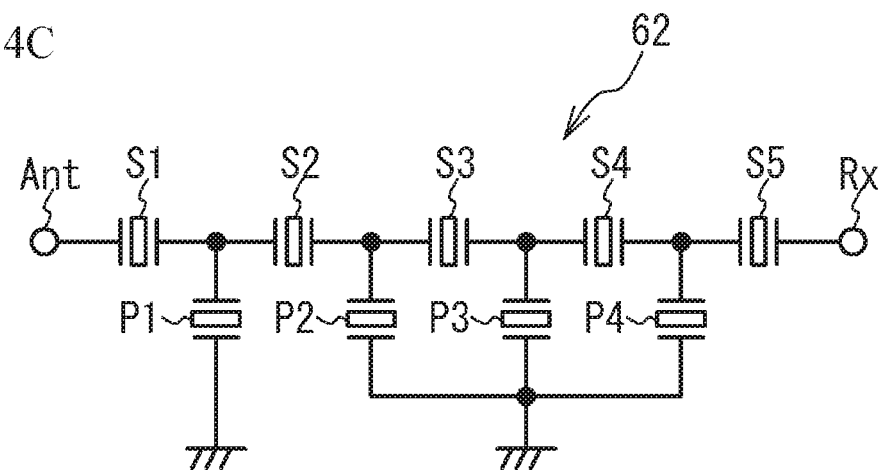

FIG. 4A is a circuit diagram of the duplexer used for the simulation, and FIG. 4B and FIG. 4C are circuit diagrams of a transmit filter and a receive filter, respectively. As illustrated in FIG. 4A, in the duplexer, a transmit filter 60 is connected between a common terminal Ant and a transmit terminal Tx. A receive filter 62 is connected between the common terminal Ant and a receive terminal Rx.

As illustrated in FIG. 4B, in the transmit filter 60, between the transmit terminal Tx and the common terminal Ant, series resonators S1 through S3 are connected in series and parallel resonators P1 through P4 are connected in parallel. As illustrated in FIG. 4C, in the receive filter 62, between the common terminal Ant and the receive terminal Rx, series resonators S1 through S5 are connected in series and parallel resonators P1 through P4 are connected in parallel.

The transmit filter 60 transmits signals in the transmit band to the common terminal Ant among high-frequency signals input to the transmit terminal Tx, and suppresses signals with other frequencies. The receive filter 62 transmits signals in the receive band to the receive terminal Rx among high-frequency signals input to the common terminal Ant, and suppresses signals with other frequencies. The passbands of the transmit filter 60 and the receive filter 62 differ from each other, and, for example, do not overlap.

Figure 5:
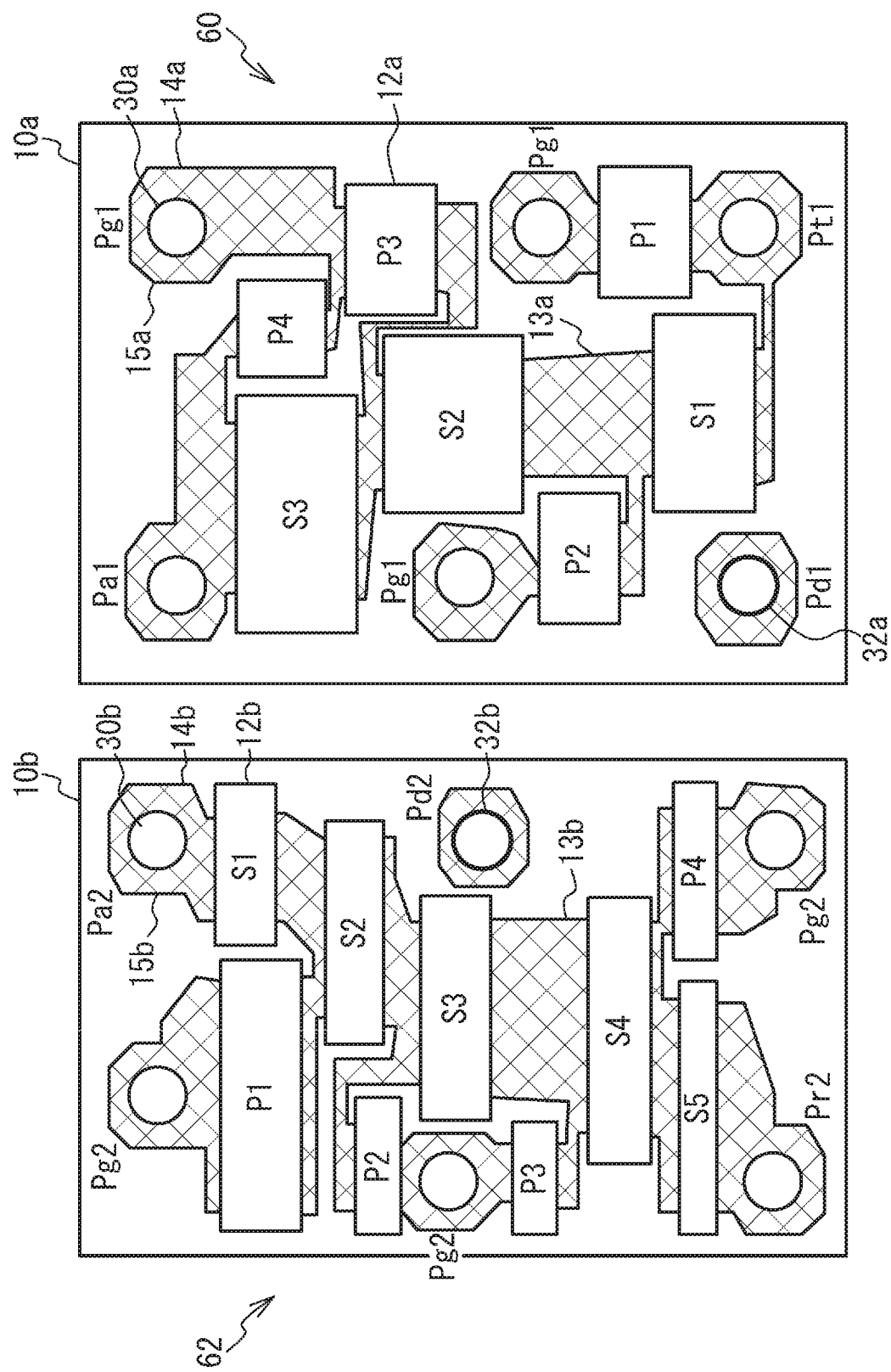
FIG. 5 presents plan views of lower surfaces of substrates 10a and 10b in samples A through D as transparently viewed from above.

FIG. 5 presents plan views of the lower surfaces of the substrates 10a and 10b in the samples A through D as transparently viewed from above. As illustrated in FIG. 5, the acoustic wave elements 12a and the metal patterns 14a are located on the lower surface of the substrate 10a. The acoustic wave elements 12a include the series resonators S1 through S3 and the parallel resonators P1 through P4. The metal patterns 14a include wiring lines 13a, which connect between the acoustic wave elements 12a, and pads 15a. The pads 15a include a transmit pad Pt1, a common pad Pa1, ground pads Pg1, and a dummy pad Pd1. The bumps 30a are bonded to the transmit pad Pt1, the common pad Pa1, and the ground pads Pg1. The dummy bump 32a is bonded to the dummy pad Pd1. The dummy bump 32a is not connected to any of the acoustic wave elements 12a (i.e., the transmit filter 60). The acoustic wave elements 12a and the metal patterns 14a form the transmit filter 60.

The acoustic wave elements 12b and the metal patterns 14b are located on the lower surface of the substrate 10b. The acoustic wave elements 12b include the series resonators S1 through S5 and the parallel resonators P1 through P4. The metal patterns 14b include wiring lines 13b, which connect between the acoustic wave elements 12b, and pads 15b. The pads 15b include a receive pad Pr2, a common pad Pa2, ground pads Pg2, and a dummy pad Pd2. The bumps 30b are bonded to the receive pad Pr2, the common pad Pa2, and the ground pads Pg2, and the dummy bump 32b is bonded to the dummy pad Pd2. The dummy bump 32b is not connected to any of the acoustic wave elements 12b. The acoustic wave elements 12b and the metal patterns 14b form the receive filter 62.

Sample A

Figure 6A:
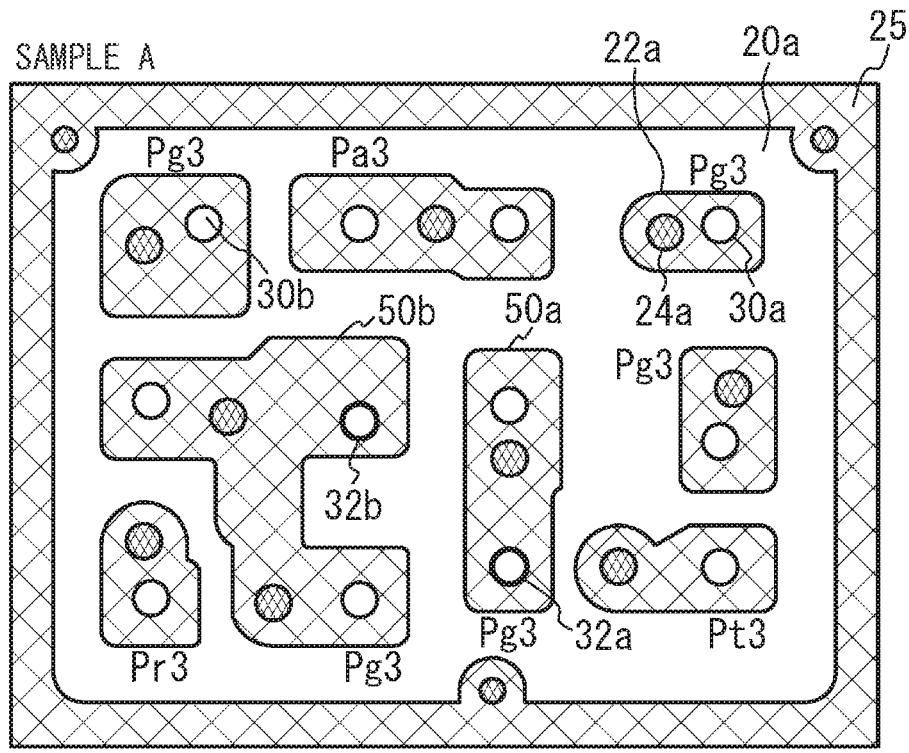
FIG. 6A and FIG. 6B are plan views of the upper surfaces of insulating layers in the sample A.
Figure 6B:
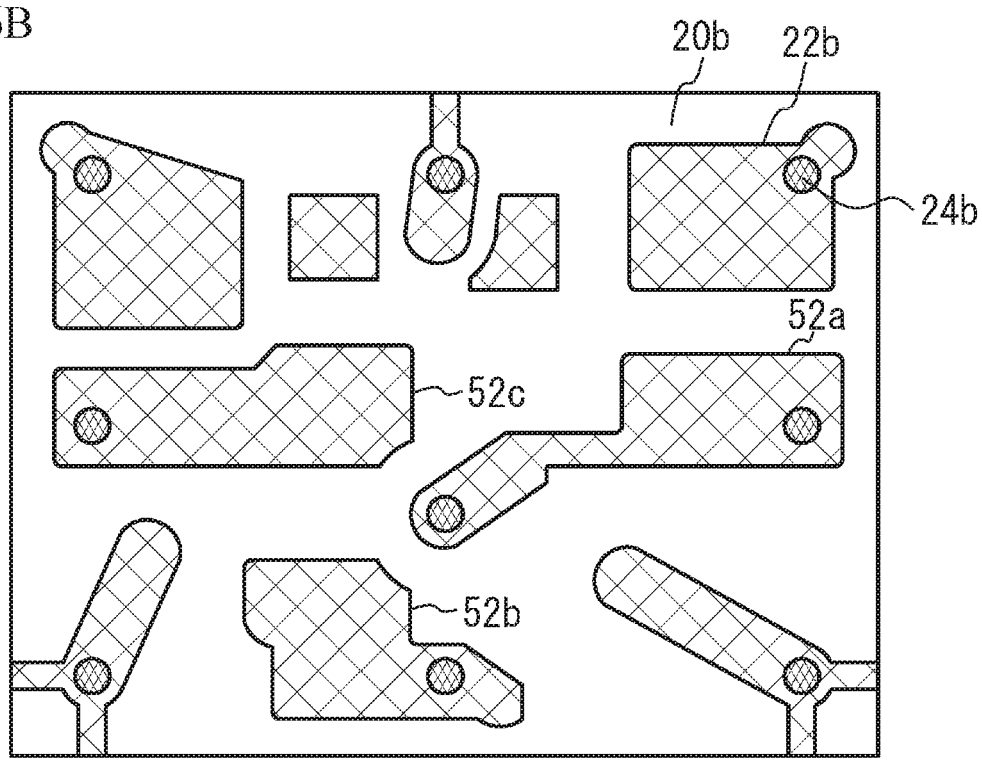
Figure 7:
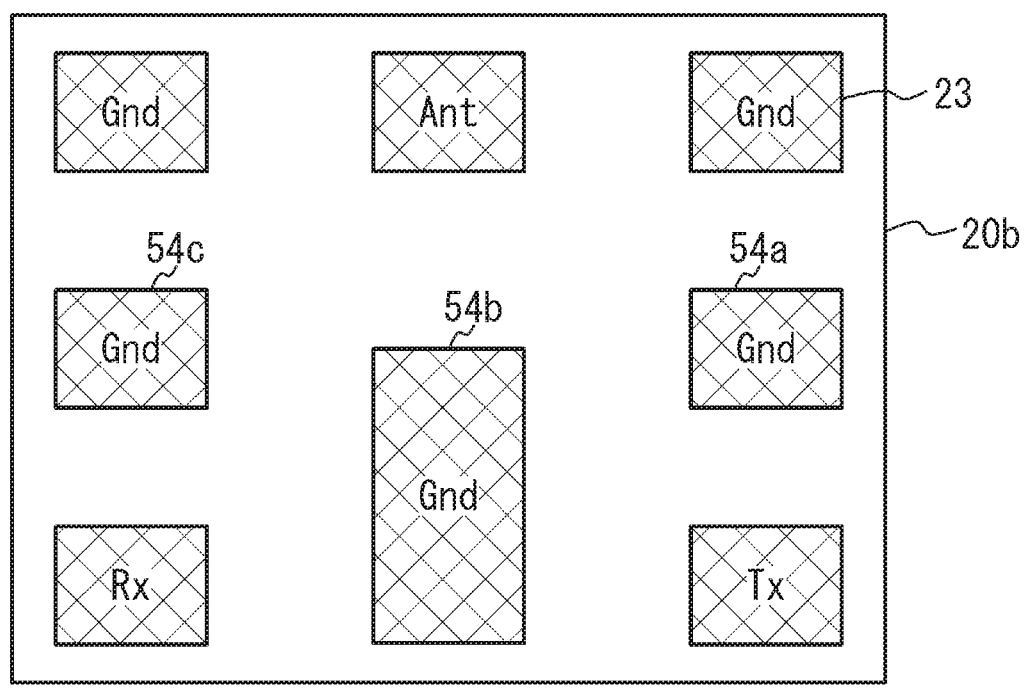
FIG. 7 is a plan view of the lower surface of an insulating layer 20b in the samples A through D as transparently viewed from above.

FIG. 6A and FIG. 6B are plan views of the upper surfaces of the insulating layers 20a and 20b in the sample A, respectively. FIG. 7 is a plan view of the lower surface of the insulating layer 20b in the samples A through D as transparently viewed from above.

As illustrated in FIG. 6A, the metal pattern 22a and the ring-shaped metal layer 25 are located on the upper surface (i.e., a die attach surface) of the insulating layer 20a. The bumps 30a and 30b and the dummy bumps 32a and 32b are bonded on the metal patterns 22a. The via wirings 24a are in contact with the lower surfaces of the metal patterns 22a. The metal patterns 22a include a transmit pad Pt3, a receive pad Pr3, a common pad Pa3, and ground pads Pg3. The transmit pad Pt3 is coupled to the transmit pad P0 of the substrate 10a through the bump 30a. The receive pad Pr3 is coupled to the receive pad Pr2 of the substrate 10b through the bump 30b. The common pad Pa3 is coupled to the common pad Pa1 of the substrate 10a through the bump 30a, and is coupled to the common pad Pa2 of the substrate 10b through the bump 30b. The ground pads Pg3 are coupled to the ground pads Pg1 of the substrate 10a through the bump 30a and to the ground pads Pg2 of the substrate 10b through the bump 30b.

A metal pattern 50a of metal patterns for the ground pads Pg3 is coupled to the dummy pad Pd1 of the substrate 10a through the dummy bump 32a. A metal pattern 50b of metal patterns for the ground pads Pg3 is coupled to the dummy pad Pd2 of the substrate 10b through the dummy bump 32b.

As illustrated in FIG. 6B, the metal patterns 22b are located on the upper surface of the insulating layer 20b. The metal patterns 22b are coupled to the metal patterns 22a through the via wirings 24a (see FIG. 6A). The via wirings 24b are in contact with the lower surfaces of the metal patterns 22b. The metal pattern 50a in FIG. 6A is coupled to a metal pattern 52a through the via wiring 24a. The metal pattern 50b in FIG. 6A is coupled to metal patterns 52b and 52c through the via wirings 24a.

As illustrated in FIG. 7, the terminals 23 are located on the lower surface of the insulating layer 20b. The terminals 23 include the transmit terminal Tx, the receive terminal Rx, the common terminal Ant, and the ground terminals Gnd (ground terminals). The transmit terminal Tx, the receive terminal Rx, the common terminal Ant, and the ground terminals Gnd are respectively electrically connected to the transmit pad Pt3, the receive pad Pr3, the common pad Pa3, and the ground pads Pg3 through the via wirings 24a and 24b and the metal patterns 22b. The metal pattern 52a in FIG. 6B is coupled to ground terminals 54a and 54b, the metal pattern 52b is coupled to the ground terminal 54b, and the metal pattern 52c is coupled to a ground terminal 54c.

In the sample A, as illustrated in FIG. 6A, the dummy bumps 32a and 32b are respectively coupled to the different metal patterns 50a and 50b.

Sample B

Figure 8A:
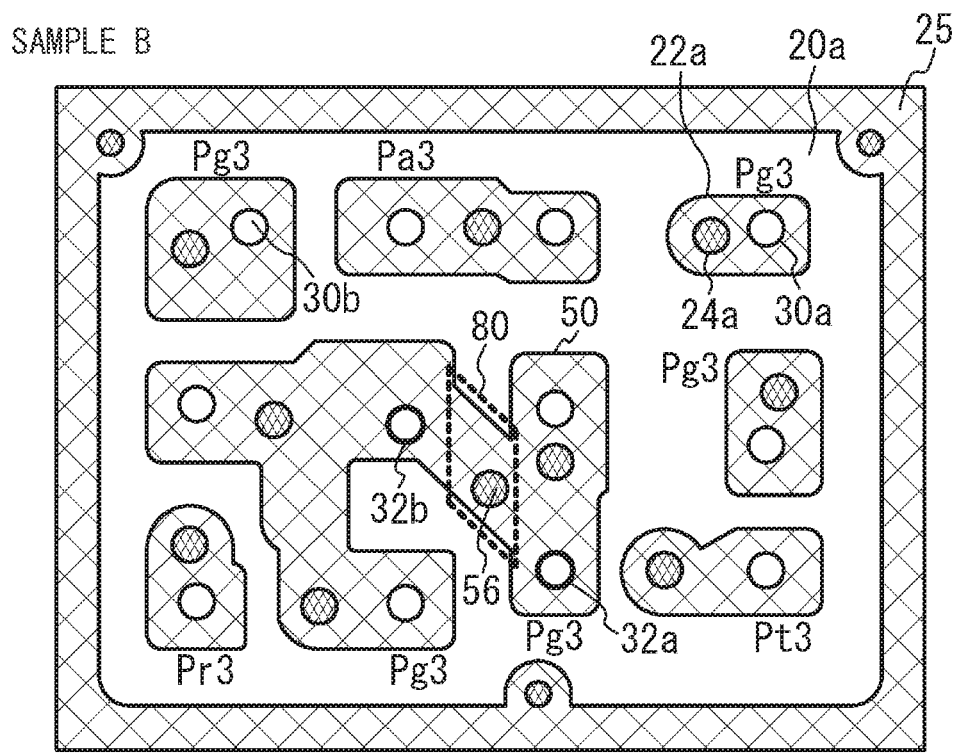
FIG. 8A and FIG. 8B are plan views of the upper surfaces of the insulating layers in the sample B.
Figure 8B:
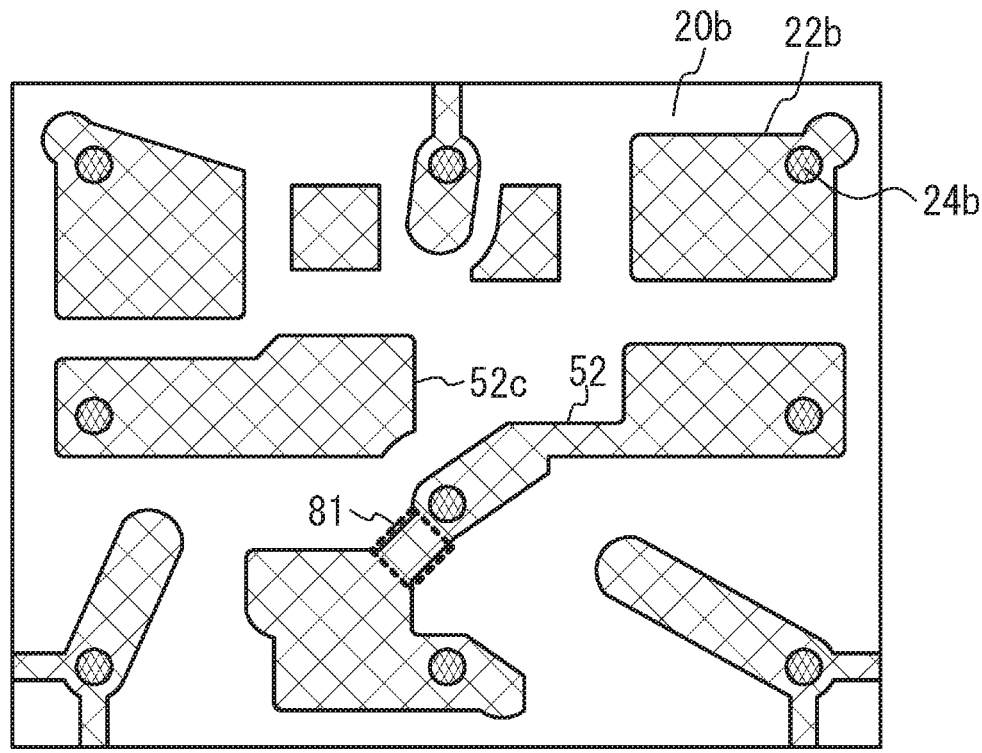

FIG. 8A and FIG. 8B are plan views of the upper surfaces of the insulating layers in the sample B. As illustrated in FIG. 8A, the sample B differs from the sample A in that the metal patterns 50a and 50b in FIG. 6A are interconnected in a region 80 to form a single metal pattern 50. Accordingly, the metal pattern 50 connects the dummy bumps 32a and 32b on the upper surface of the insulating layer 20a. As illustrated in FIG. 8B, the metal patterns 52a and 52b in FIG. 6B are interconnected in a region 81 to form a metal pattern 52. In the region between the dummy bumps 32a and 32b, the metal pattern 50 is coupled to the metal pattern 52 through a via wiring 56 that is one of the via wirings 24a. Other structures are the same as those of the sample A, and the description thereof is thus omitted.

Sample C

Figure 9A:
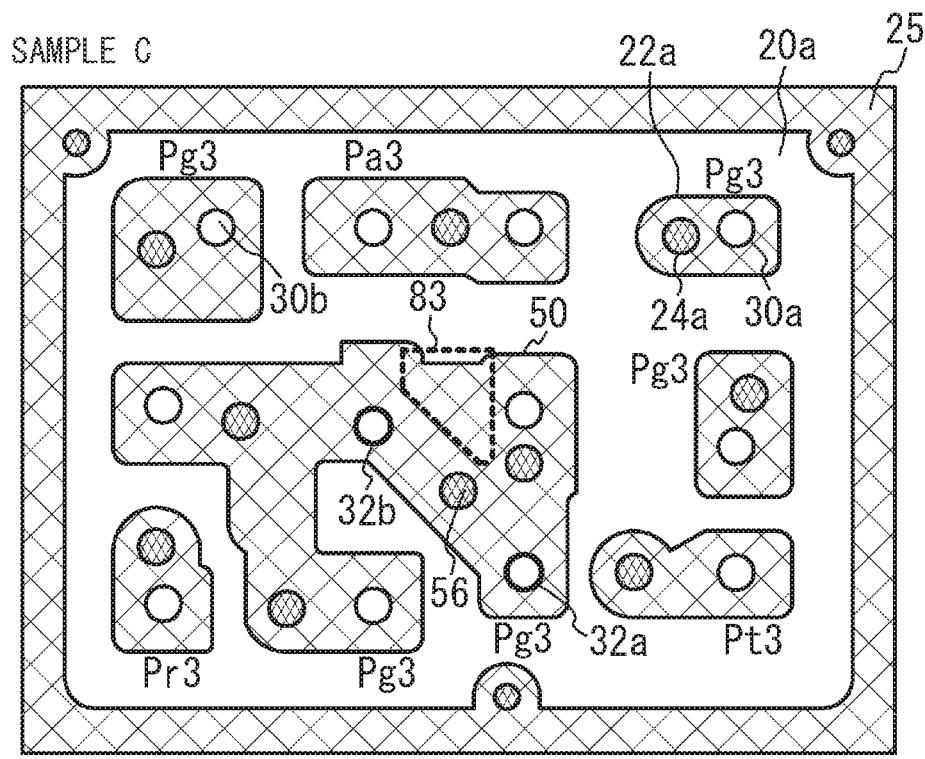
FIG. 9A and FIG. 9B are plan views of the upper surfaces of the insulating layers in the sample C.
Figure 9B:
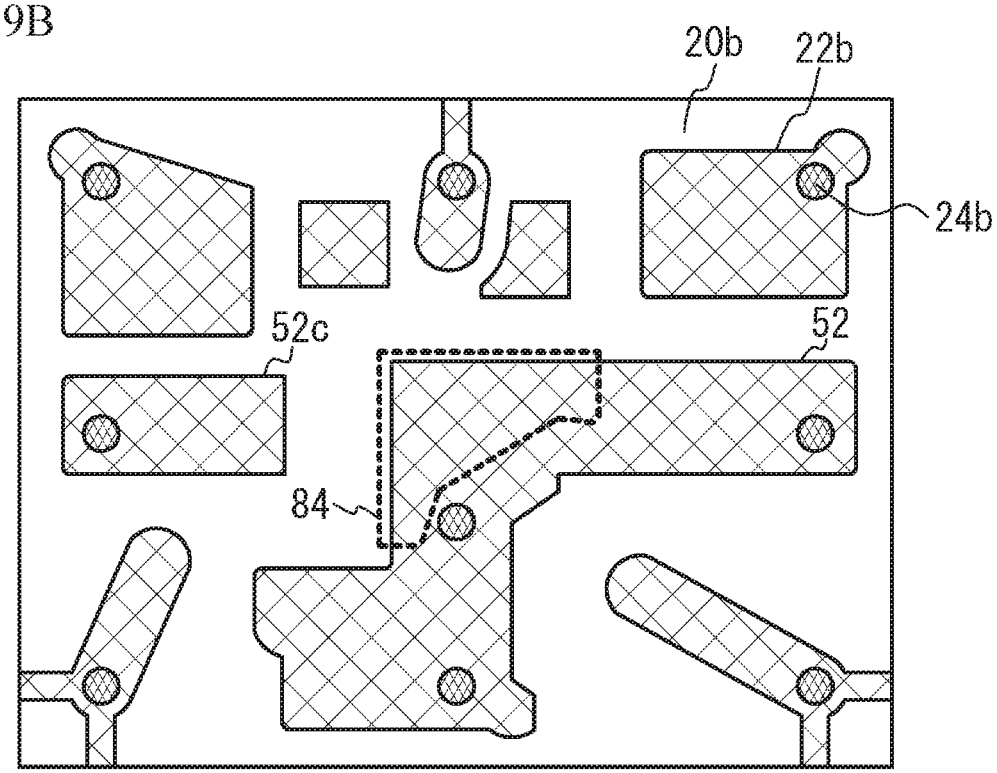

FIG. 9A and FIG. 9B are plan views of the upper surfaces of the insulating layers in the sample C. As illustrated in FIG. 9A, the sample C differs from the sample B in that the metal pattern 50 is located in a region 83. As illustrated in FIG. 9B, the metal pattern 52 is located in a region 84. As illustrated, the area of the metal patterns 50 and 52 in the sample C is greater than that in the sample B. Other structures are the same as those of the sample B, the description thereof is thus omitted.

Sample D

Figure 10A:
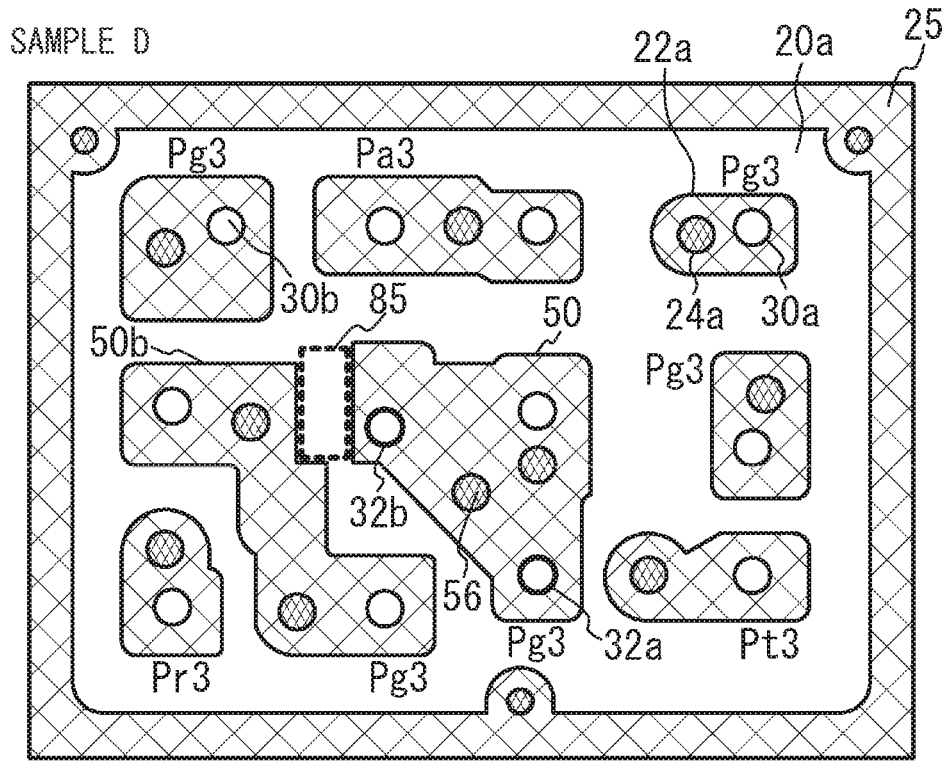
FIG. 10A and FIG. 10B are plan views of the upper surfaces of the insulating layers in the sample D.
Figure 10B:
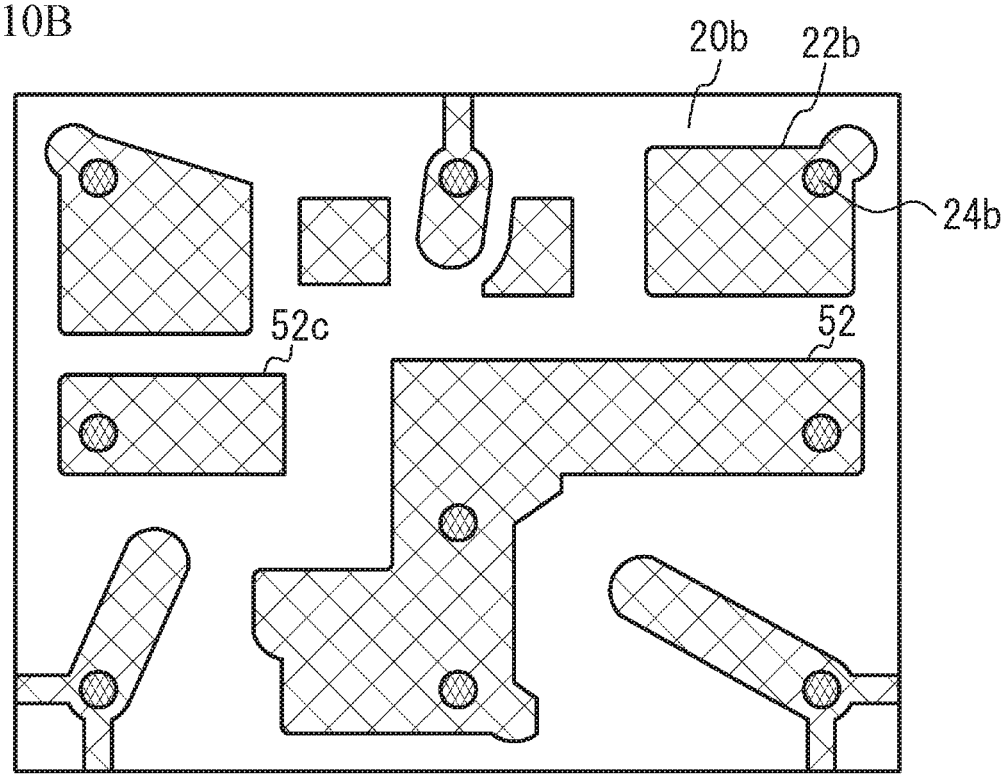

FIG. 10A and FIG. 10B are plan views of the upper surfaces of the insulating layers in the sample D. As illustrated in FIG. 10A, the sample D differs from the sample B in that the metal pattern 50 to which the dummy bumps 32a and 32b are bonded is separated from the metal pattern 50b to which the ground pad Pg3 of the substrate 10b is connected. As illustrated in FIG. 10B, the metal patterns 52a and 52b are the same as those of the sample C. Other structures are the same as those of the sample C, and the description thereof is thus omitted.

The simulation conditions in the samples A through D are as follows.

Substrate 10a:
    Material: 42° rotated Y-cut X-propagation lithium tantalate substrate
    Dimensions: 0.7 mm×0.9 mm
    Thickness: 0.15 mm Substrate 10b:
    Material: 42° rotated Y-cut X-propagation lithium tantalate substrate
    Dimensions: 0.6 mm×0.9 mm
    Thickness: 0.15 mm IDT 40, Reflectors 42
    Material: Aluminum
    Film thickness: 0.1 μm Substrate 20:
    Material: HTCC
    Dimensions: 1.7 mm×1.3 mm
    Thickness of the insulating layer 20a: 0.1 mm
    Thickness of the insulating layer 20b: 0.051 mm Metal pattern 22a, Ring-shaped metal layer 25:
    Material: Tungsten
    Film thickness: 15 μm Metal pattern 22b:
    Material: Tungsten
    Film thickness: 7 μm Terminal 23:
    Material: Tungsten
    Film thickness: 15 μm Via wiring 24a:
    Material: Tungsten
    Diameter: 75 μm Via wiring 24b:
    Material: Tungsten
    Diameter: 75 μm Bumps 30a and 30b, Dummy bumps 32a and 32b
    Material: Gold
    Height: 12.5 μm
    Diameter: 60 μm Sealing portion 34:
    Material: Tin silver solder Lid 36:
    Material: Kovar
    Film thickness: 25 μm Protective film 38:
    Material: Nickel
    Film thickness: 10 μm Resin substrate 66:
    Material: Bismaleimide-Triazine (BT) resin
    Film thickness: 50 μm Metal layer 68:
    Material: Copper
    Film thickness: 28 μm Solder 69:
    Material: Tin silver copper solder
    Film thickness: 40 μm The thermal conductivity of each material was assumed as follows.

Lithium tantalate substrate: 4.6 W/m·° C.
IDT: 210 W/m·° C.
HTCC: 18 W/m·° C.
Tungsten: 163.3 W/m·° C.
Gold: 301 W/m·° C.
Tin silver solder: 33 W/m·° C.
Nickel: 60.7 W/m·° C.
Kovar: 17.3 W/m·° C.
BT resin: 0.8 W/m·° C.
Copper: 401 W/m·° C.
Tin silver copper solder: 55 W/m·° C.
Air: 0.0241 W/m·° C.

The heat transfer coefficient between the acoustic wave device in FIG. 3, solder 69, and the mounting board 64 and the atmosphere was assumed to be 9.3 W/m$^2$·° C., and the atmosphere temperature was assumed to be 25° C. The transmit filter 60 and the receive filter were assumed to be filters for Band7 (transmit band: 2500 MHz to 2570 MHz, receive band: 2620 MHz to 2690 MHz). A high-frequency signal in the transmit band of 33 dBm was input to the transmit terminal Tx. The following presents simulation results of the temperature of the dummy bump 32a and the isolation characteristic of the duplexer.

Figure 11:
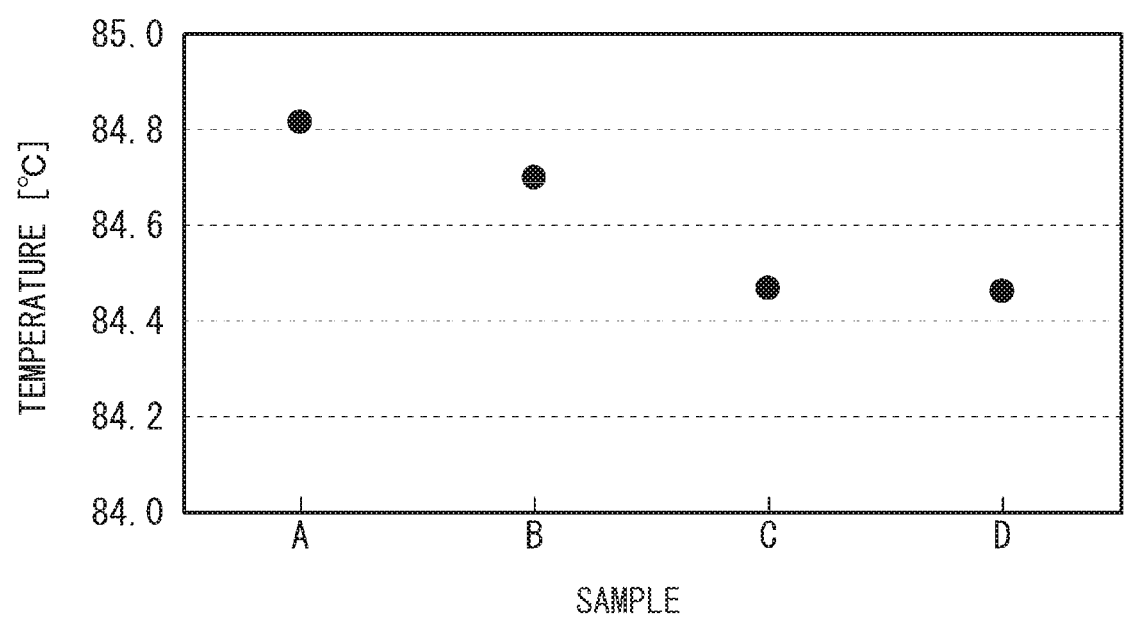
FIG. 11 illustrates temperatures of dummy bumps in the samples A through D.

FIG. 11 illustrates the temperatures of the dummy bumps in the samples A through D. The temperature is the temperature of the boundary face between the dummy bump 32a and the metal pattern 22a. As illustrated in FIG. 11, the temperature of the dummy bump 32a in the sample A is approximately 84.8° C. In the sample B, the temperature of the dummy bump 32a is less than that in the sample A by approximately 0.1° C. In the samples C and D, the temperature of the dummy bump 32a is less than that in the sample A by approximately 0.35° C.

Figure 12:
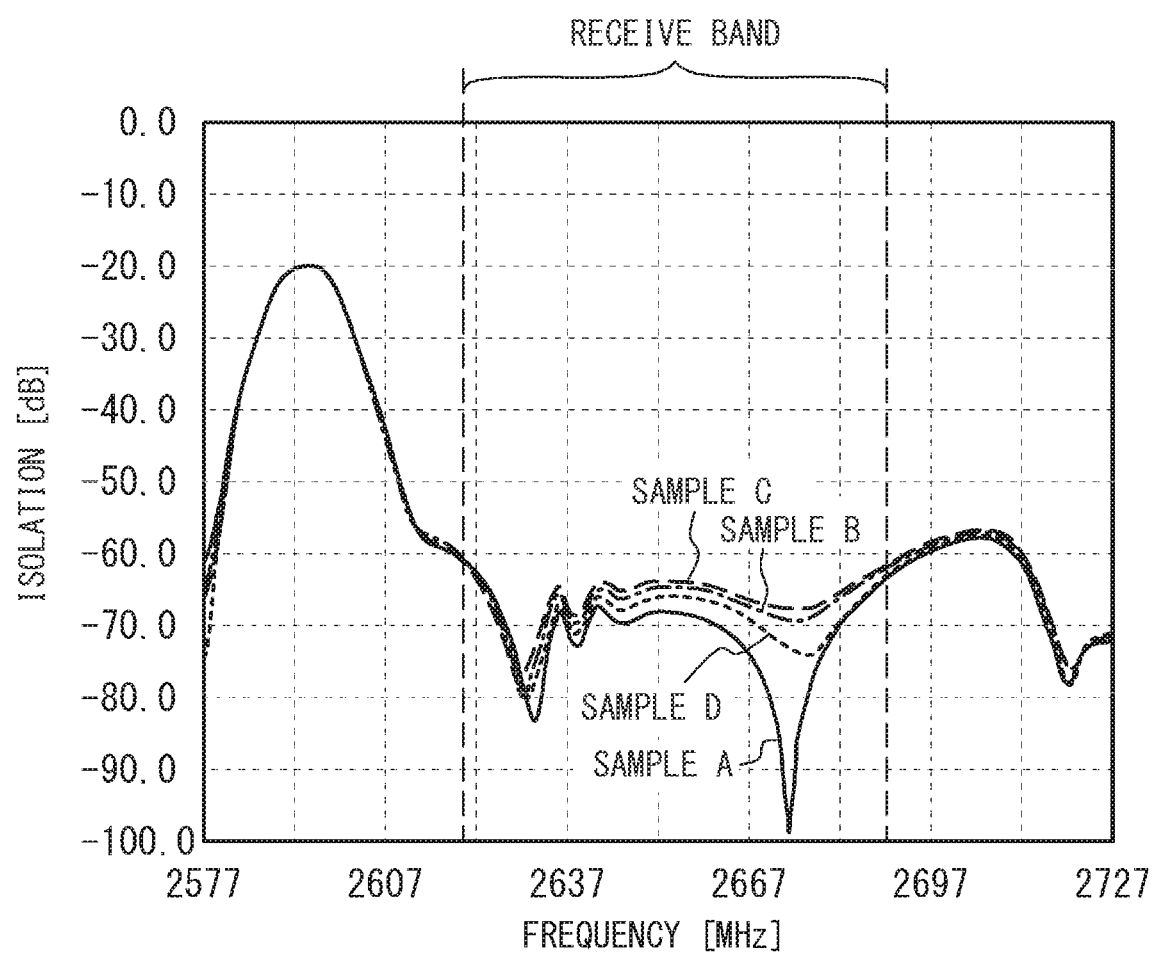
FIG. 12 illustrates isolation characteristics of duplexers in the samples A through D.

FIG. 12 illustrates the isolation characteristics of the duplexers in the samples A through D. The isolation characteristic is the isolation characteristic from the transmit terminal Tx to the receive terminal Rx. As illustrated in FIG. 12, in the samples B and C, the isolation in the receive band deteriorates compared to the sample A. The isolation in the sample D is substantially equal to the isolation in the sample A.

In the transmit filter 60 and the receive filter 62, the transmit filter 60 is applied with a larger high-frequency signal. Thus, it is desired that heat generated in the transmit filter 60 is efficiently released to the terminal 23 through the dummy bump 32a.

As in the sample A, when the metal patterns 50a and 50b to which the dummy bumps 32a and 32b are respectively bonded are separated on the upper surface of the insulating layer 20a, the area of the metal pattern 50a cannot be made to be large. Thus, the heat of the dummy bump 32a is not efficiently released. Thus, as illustrated in FIG. 11, the temperature of the dummy bump 32a in the sample A is high.

As in the sample B, the metal pattern 50 to which the dummy bumps 32a and 32b are bonded is made to be a single metal pattern. This structure allows the area of the metal pattern 50 to which the dummy bump 32a is bonded to be large. Accordingly, the heat is efficiently released from the dummy bump 32a. Thus, as illustrated in FIG. 11, the temperature of the dummy bump 32a in the sample B is less than that in the sample A.

As in the sample C, as the area of the single metal pattern 50 is increased, the heat is more efficiently released from the dummy bump 32a. Thus, as illustrated in FIG. 11, the temperature of the dummy bump 32a in the sample C is less than that in the sample B.

However, in the samples B and C, the metal pattern 50 is coupled to the ground terminal of the transmit filter 60 and the ground terminal of the receive filter 62. This structure causes high-frequency signals to leak from the ground terminal of the transmit filter 60 through the ground terminal of the receive filter 62. Thus, as illustrated in FIG. 12, in the samples B and C, the isolation characteristics deteriorate compared to that in the sample A.

In the sample D, the dummy bumps 32a and 32b are bonded to the single metal pattern 50. The metal pattern 50 is separated from the metal pattern 50b, which is coupled to the ground terminal of the receive filter 62, on the upper surface of the insulating layer 20a. Accordingly, in the sample D, the temperature of the dummy bump 32a can be made to be approximately equal to that in the sample C as illustrated in FIG. 11, and the isolation characteristic can be made to be approximately equal to the isolation characteristic in the sample A as illustrated in FIG. 12.

In the first embodiment, the metal pattern 50 (a first metal pattern) is located on the upper surface of the substrate 20, is in contact with the dummy bumps 32a and 32b, and connects the dummy bumps 32a and 32b. The metal pattern 50 is electrically connectable to the ground terminal Gnd (a terminal) located on the lower surface of the substrate 20. The terminal 23 to which the metal pattern 50 is connected may be other than the ground terminal Gnd.

This structure enables to expand the metal pattern 50 to the region to which the dummy bump 32b of the substrate 10b is bonded as in the samples B through D. Thus, the efficiency of heat release from the dummy bump 32a is improved.

Additionally, as in the samples B through D, the via wiring 56 (a first via wiring) that is in contact with the metal pattern 50 between the dummy bumps 32a and 32b and penetrates through the insulating layer 20a (a first insulating layer) is provided, and the metal pattern 50 is electrically connected to the ground terminal Gnd through the via wiring 56. This structure allows the heat of the dummy bump 32a to be efficiently released through the via wiring 56.

The metal pattern 50 is connected to the metal pattern 52 (a second metal pattern), which is located on the upper surface of the insulating layer 20b, through the via wiring 56 and another via wiring 24a that are connected in parallel to each other between the metal pattern 50 and the metal pattern 52. Since the metal patterns 50 and 52 are coupled by a plurality of the via wirings 56 and 24a, the heat release efficiency is further improved.

Furthermore, as in the samples B through D, the single metal pattern 50 is coupled to a plurality of the ground terminals Gnd. This structure further improves the heat release efficiency.

As in the samples B and D, the single metal pattern 50 is coupled to a plurality of the metal patterns 52 and 52c. This structure further improves the heat release efficiency.

The acoustic wave elements 12a include one or more first acoustic wave resonators included in the transmit filter 60 (a first filter). The acoustic wave elements 12b include one or more second acoustic wave resonators included in the receive filter 62 (a second filter) having a passband different from that of the transmit filter 60. As described above, the acoustic wave elements 12a and 12b can be the acoustic wave resonators included in a filter.

As in the sample D, the metal pattern 50 is electrically separated from at least one of a third metal pattern electrically connected to the ground pad of the transmit filter 60 and a fourth metal pattern electrically connected to the ground pad of the receive filter 62 in the upper surface of the substrate 20. This structure improves the isolation between the transmit filter 60 and the receive filter 62.

First Variation of the First Embodiment

Figure 13:
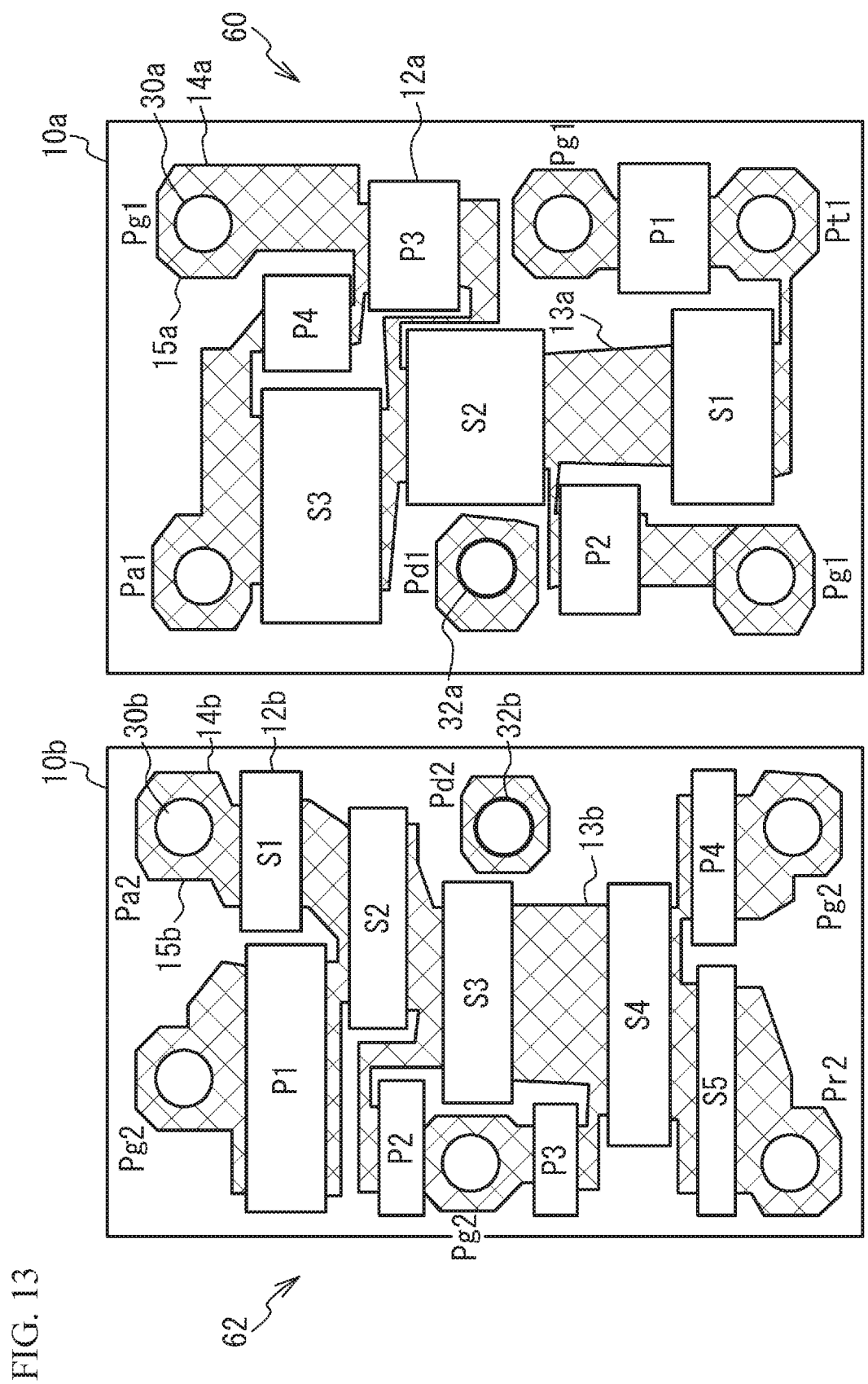
FIG. 13 presents plan views of the lower surfaces of the substrates 10a and 10b in a first variation of the first embodiment as transparently viewed from above.

FIG. 13 presents plan views of the lower surfaces of the substrates 10a and 10b in a first variation of the first embodiment as transparently viewed from above. As illustrated in FIG. 13, the dummy pad Pd1 and the dummy bump 32a are located near the series resonator S2. Other structures are the same as those of the first embodiment, and the description thereof is thus omitted.

In the ladder-type filter, a high-frequency signal mainly passes through the series resonators S1 through S3. Thus, the dummy bump 32a is preferably located near the series resonators S1 through S3. The resonator closest to at least one of the dummy bumps 32a is preferably at least one of the series resonators S1 through S3.

The largest high-frequency signal is input to the series resonator S1 closest to the transmit pad Pt1 among the series resonators S1 through S3. Thus, the temperature of the series resonator S1 may become the highest. In this case, as in the first embodiment, the resonator closest to at least one of the dummy bumps 32a is preferably the series resonator S1 closest to the transmit pad Pt1.

The temperature of the series resonator S2 to which the series resonators S1 and S3 located at both sides of the series resonator S2 are coupled may become the highest because the heat is hard to be released. In this case, as in the first variation of the first embodiment, the resonator closest to at least one of the dummy bumps 32a is preferably the series resonator S2 to which the series resonators S1 and S3 located at both sides of the series resonator S2 are coupled.

Second Variation of the First Embodiment

Figure 14:
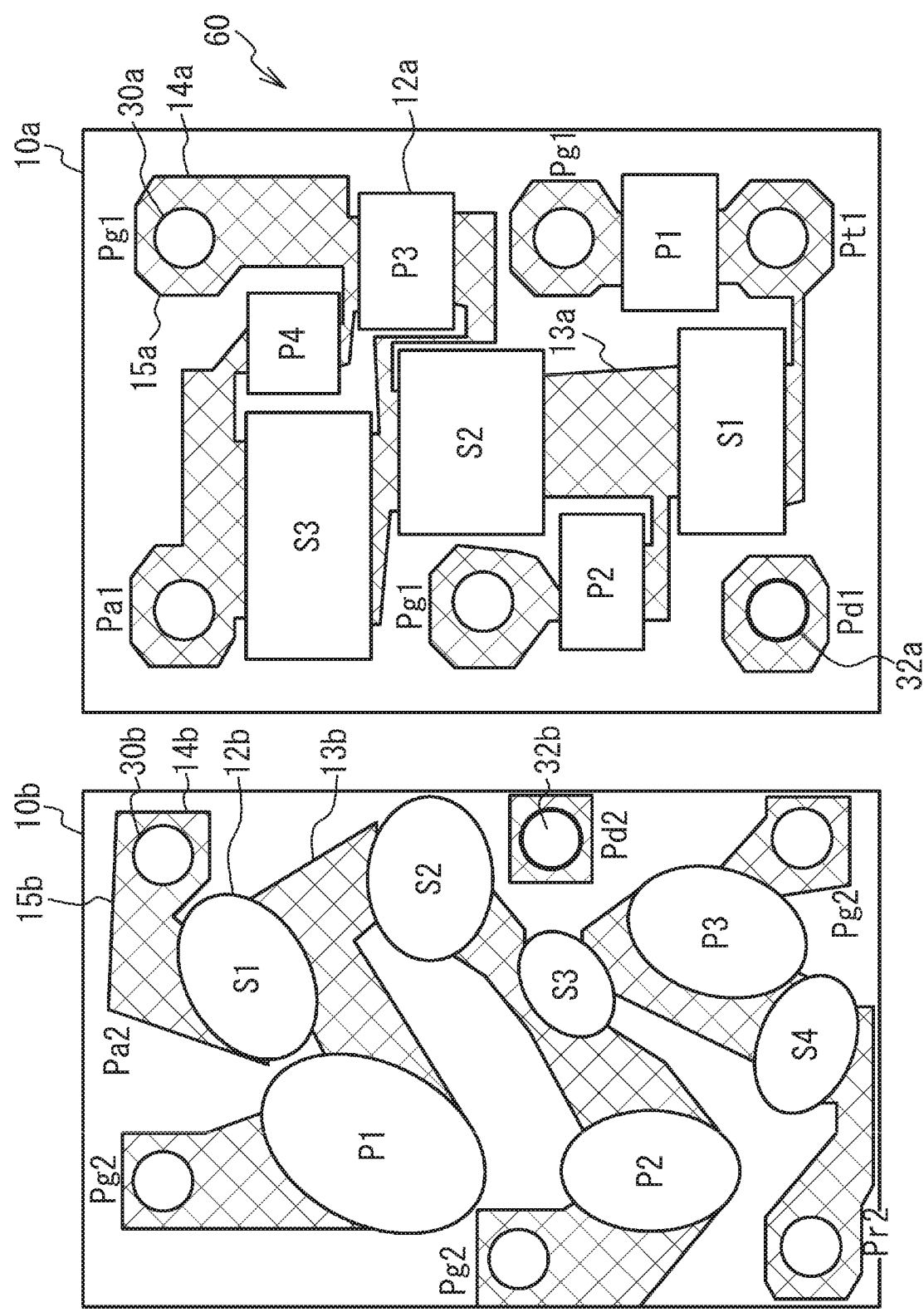
FIG. 14 presents plan views of the lower surfaces of the substrates 10a and 10b in a second variation of the first embodiment as transparently viewed from above.

FIG. 14 presents plan views of the lower surfaces of the substrates 10a and 10b in a second variation of the first embodiment as transparently viewed from above. As illustrated in FIG. 14, piezoelectric thin film resonators as the acoustic wave elements 12b are located on the lower surface of the substrate 10b. The cross-section of the piezoelectric thin film resonator is the same as the cross-section illustrated in FIG. 2B. Between the common pad Pa2 and the receive pad Pr2, the series resonators S1 through S4 are connected in series and the parallel resonators P1 through P3 are connected in parallel. Other structures are the same as those of the first embodiment, and the description thereof is thus omitted.

As in the second variation of the first embodiment, at least one of the acoustic wave elements 12a and 12b may be a piezoelectric thin film resonator.

Third Variation of the First Embodiment

Figure 15:
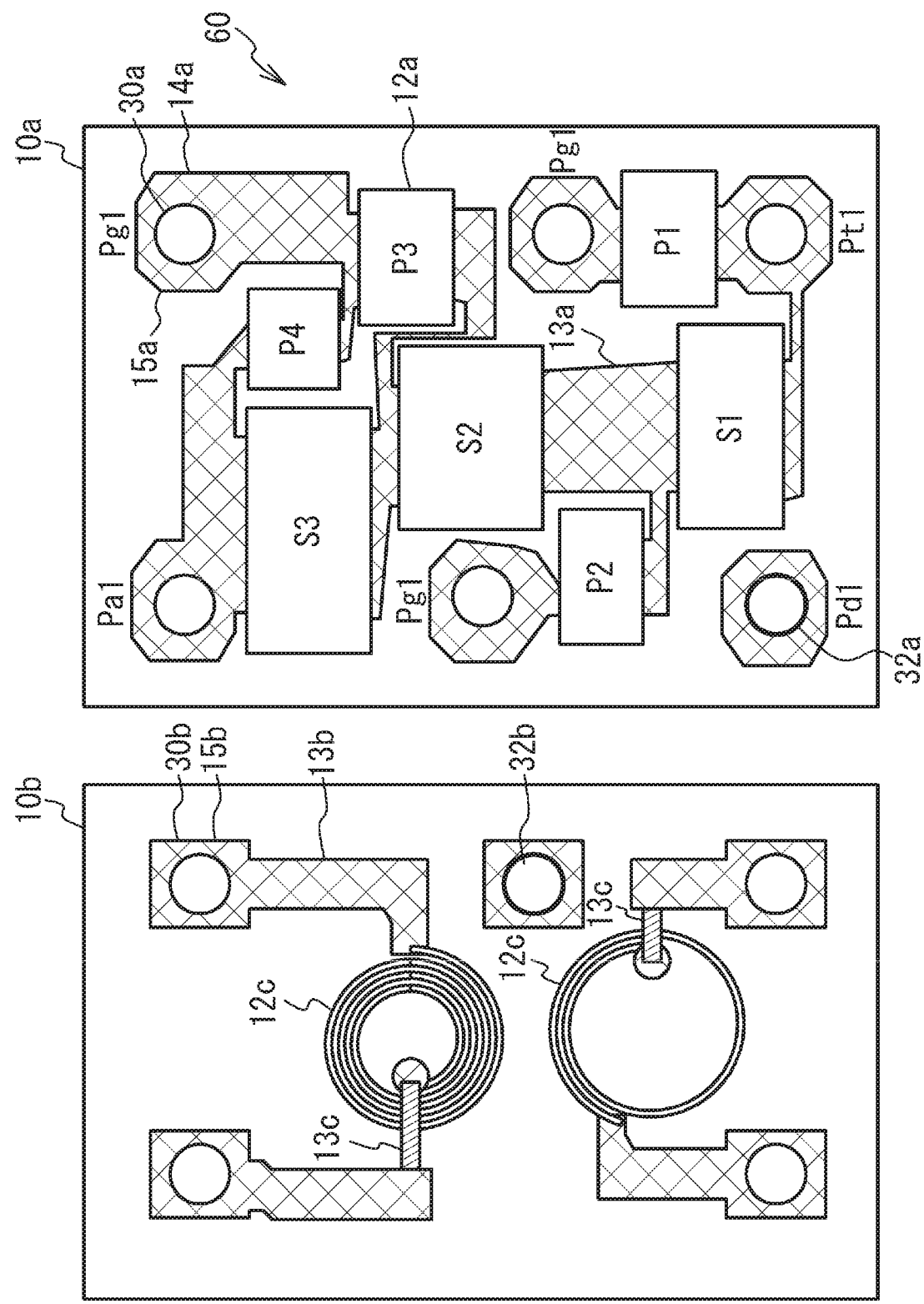
FIG. 15 presents plan views of the lower surfaces of the substrates 10a and 10b in a third variation of the first embodiment as transparently viewed from above.

FIG. 15 presents plan views of the lower surfaces of the substrates 10a and 10b in a third variation of the first embodiment as transparently viewed from above. As illustrated in FIG. 15, coils 12c are located on the lower surface of the substrate 10b. The coil 12c and the pad 15b are interconnected through wiring lines 13b and 13c. The wiring line 13c is a wiring line intersecting with the coil 12c. Other structures are the same as those of the first embodiment, and the description thereof is thus omitted.

As in the third variation of the first embodiment, the functional element may not be necessarily the acoustic wave element 12b, and may be a passive element instead. The passive element may be at least one of an inductor and a capacitor.

Second Embodiment

Figure 16:
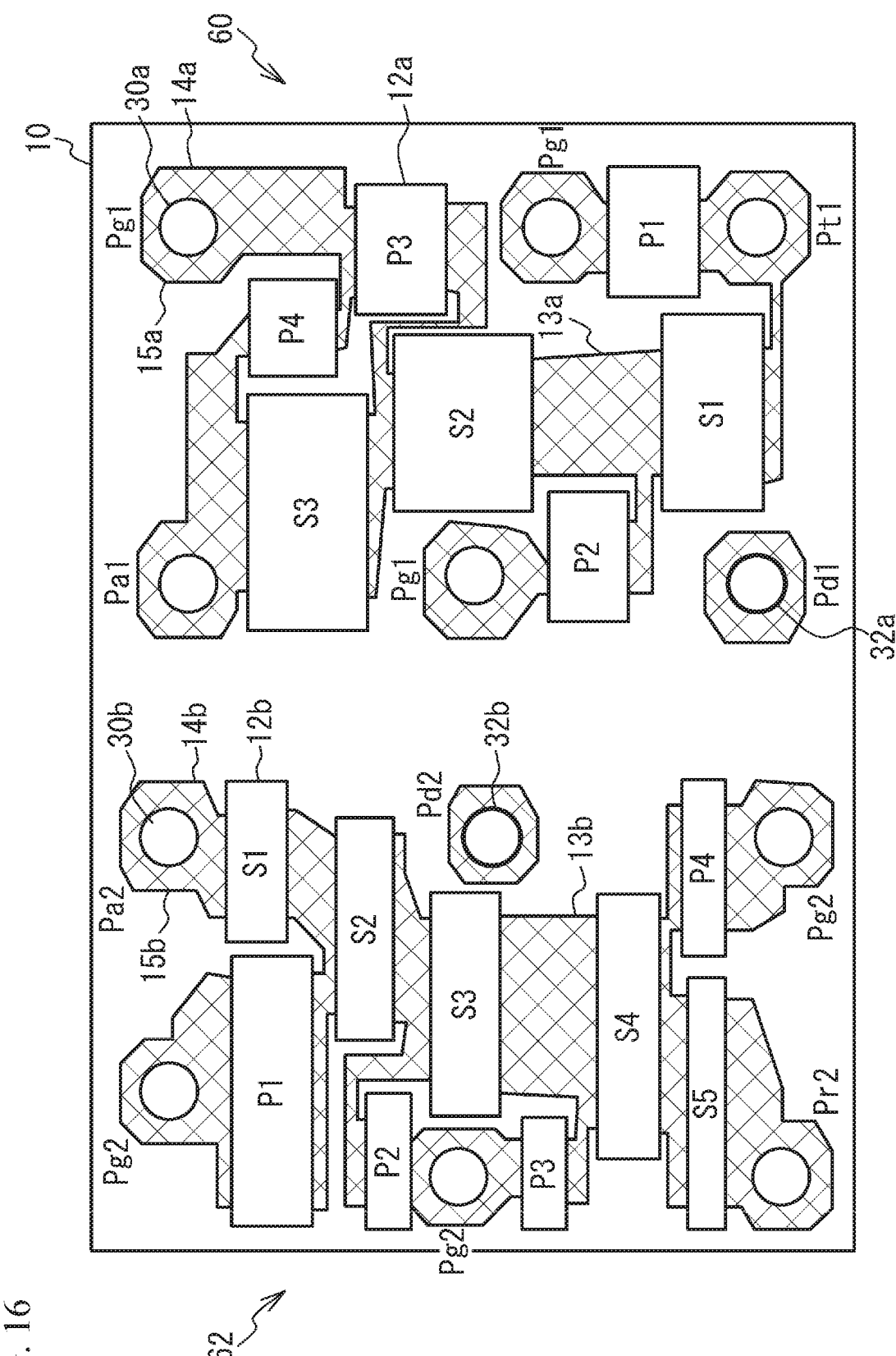
FIG. 16 is a plan view of the lower surface of a substrate 10 in a second embodiment as transparently viewed from above.

FIG. 16 is a plan view of the lower surface of the substrate 10 in a second embodiment as viewed from above. As illustrated in FIG. 16, the acoustic wave elements 12a and 12b are located on the same substrate 10. The structure of the substrate 20 and the like are the same as those of the samples B through D in the first embodiment, and the description thereof is thus omitted.

In the second embodiment, the acoustic wave elements 12a (a first acoustic wave element) and 12b (a second acoustic wave element) are located on the lower surface (a first surface) of the substrate 10a (a first substrate). The dummy bump 32a is located closer to the acoustic wave element 12a than to the acoustic wave element 12b in plan view, and is electrically separated from (for example, is electrically independent from) the acoustic wave elements 12a and 12b and the metal patterns 14a and 14b that are respectively electrically connected to the acoustic wave elements 12a and 12b. The dummy bump 32b is located closer to the acoustic wave element 12b than to the acoustic wave element 12a in plan view, and is electrically separated from (for example, is electrically independent from) the acoustic wave elements 12a and 12b and the metal patterns 14a and 14b that are respectively electrically connected to the acoustic wave elements 12a and 12b in the substrate 10. The dummy bumps 32a and 32b are bonded to the metal pattern 50 located on the upper surface (a second surface) of the substrate 20 (a second substrate). The ground terminal Gnd located on the lower surface (a third surface) of the substrate 20 is connectable to the metal pattern 50.

This structure allows the metal pattern 50, to which the dummy bump 32a is bonded, to expand to the region of the dummy bump 32b located near the acoustic wave element 12b. Thus, the efficiency of heat release from the dummy bump 32a is improved.

As in the first embodiment, the acoustic wave elements 12a may include one or more first acoustic wave resonators included in the transmit filter 60, and the acoustic wave elements 12b may include one or more second acoustic wave resonators included in the receive filter 62 having a passband different from that of the transmit filter 60. The acoustic wave resonator closest to the dummy bump 32a in plan view is at least one of the one or more first acoustic wave resonators, and the acoustic wave resonator closest to the dummy bump 32b in plan view is at least one of the one or more second acoustic wave resonators.

As with the sample D of the first embodiment, the metal pattern 50 is not electrically connected to at least one of the second metal pattern, which is electrically connected to the ground pad of the transmit filter 60, and the third metal pattern, which is electrically connected to the ground pad of the receive filter 62, in the upper surface of the substrate 20. Thus, the isolation between the transmit filter 60 and the receive filter 62 is improved. The common pad Pa1 of the transmit filter 60 and the common pad Pa2 of the receive filter 62 are not electrically connected in the substrate 10, but may be electrically connected in the substrate 10.

First and Second Variations of the Second Embodiment

Figure 17A:
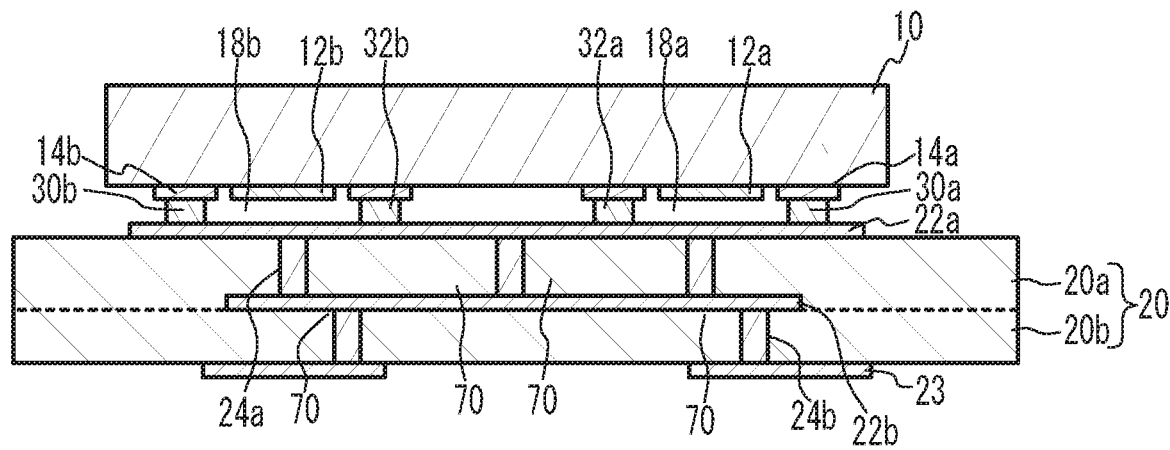
FIG. 17A and FIG. 17B are cross-sectional views of acoustic wave devices in accordance with first and second variations of the second embodiment.
Figure 17B:
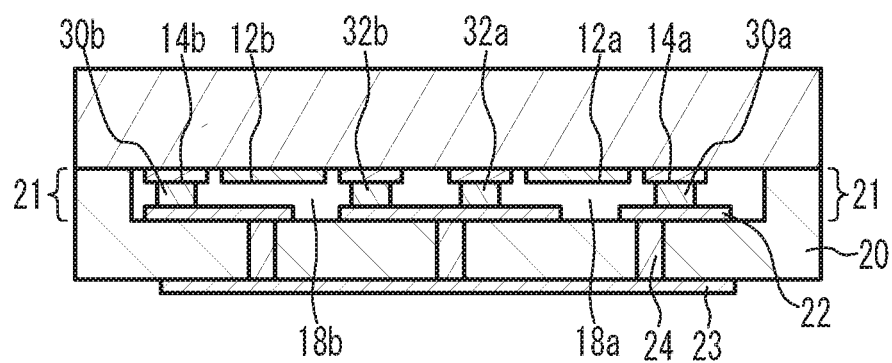

FIG. 17A and FIG. 17B are cross-sectional views of acoustic wave devices in accordance with first and second variations of the second embodiment, respectively. As illustrated in FIG. 17A, the substrate 10 is flip-chip mounted on the substrate 20. No sealing portion is provided. Other structures are the same as those of the second embodiment and the fourth variation of the first embodiment, and the description thereof is thus omitted. As in the first variation of the second embodiment, the sealing portion may not be necessarily provided.

As illustrated in FIG. 17B, the substrate 20 is a cap portion, and is made of, for example, an inorganic material such as silicon, alumina, spinel, sapphire, or glass, or resin. The substrate 20 has a protrusion portion 21 protruding toward the substrate 10 in the periphery or the substrate 20. The upper surface of the protrusion portion 21 is bonded to the lower surface in the periphery of the substrate 10. The bumps 30a and 30b and the dummy bumps 32a and 32b are coupled to metal patterns 22 located on the upper surface of the substrate 20. The metal patterns 22 are connected to the terminals located on the lower surface of the substrate 20 by via wirings 24 penetrating through the substrate 20. Other structures are the same as those of the first variation of the second embodiment, and the description thereof is thus omitted. As in the second variation of the second embodiment, the substrate 20 may be a cap provided so as to cover the acoustic wave elements 12a and 12b of the substrate 10.

The first and second embodiments and the variations thereof describe an example in which the first filter and the second filter are respectively the transmit filter 60 and the receive filter 62, but both the first and second filters may be transmit filters, or receive filters. An example in which the multiplexer is a duplexer is described, but the multiplexer may be a triplexer or a quadplexer. The number of series resonators and parallel resonators in a ladder-type filter can be freely selected. An example in which the filter is a ladder-type filter is described, but the filter may be a multimode filter. The acoustic wave elements 12a and 12b may not be necessarily a filter. One of the acoustic wave elements 12a and 12b may be a functional element such as a passive element, or a Micro Electro Mechanical Systems (MEMS) element.

Although the embodiments of the present invention have been described in detail, it is to be understood that the various change, substitutions, and alterations could be made hereto without departing from the spirit and scope of the invention.

What is claimed is:

1. An acoustic wave device comprising:
    a first substrate having a first surface;
    an acoustic wave element located on the first surface;
    a second substrate having a second surface;
    a functional element located on the second surface;
    a third substrate having a third surface and a fourth surface, the third surface being exposed to an air gap and facing the first surface and the second surface across the air gap, the fourth surface being an opposite surface of the third substrate from the third surface;
    a first metal layer that is electrically independent from the acoustic wave element and a wiring line electrically connected to the acoustic wave element in the first substrate and connects the first surface and the third surface;
    a second metal layer that connects the second surface and the third surface;
    a first metal pattern that is located on the third surface, is in contact with the first metal layer and the second metal layer, and connects the first metal layer and the second metal layer; and
    a terminal that is located on the fourth surface and is electrically connectable to the first metal pattern.

2. The acoustic wave device according to claim 1, further comprising:
    a first insulating layer included in the third substrate and having the third surface; and
    a first via wiring being in contact with the first metal pattern between the first metal layer and the second metal layer and penetrating through the first insulating layer, wherein
    the first metal pattern is electrically connected to the terminal through the first via wiring.

3. The acoustic wave device according to claim 2, further comprising:
    a second via wiring being in contact with the first metal pattern and penetrating through the first insulating layer;
    a second insulating layer included in the third substrate, located between the first insulating layer and the fourth surface, and having a fifth surface; and
    a second metal pattern located on the fifth surface, connected to the terminal, and connected to the first metal pattern through the first via wiring and the second via wiring, the first via wiring and the second via wiring being connected in parallel to each other between the first metal pattern and the second metal pattern.

4. The acoustic wave device according to claim 1, wherein
    the acoustic wave element includes one or more first acoustic wave resonators included in a first filter, and
    the functional element includes one or more second acoustic wave resonators included in a second filter having a passband different from a passband of the first filter.

5. The acoustic wave device according to claim 4, further comprising:
    a third metal pattern located on the third surface and electrically connected to a ground pad of the first filter; and
    a fourth metal pattern located on the third surface and electrically connected to a ground pad of the second filter, wherein
    the first metal pattern is electrically independent from at least one of the third metal pattern and the fourth metal pattern in the third surface.

6. The acoustic wave device according to claim 1, wherein the functional element is at least one of an inductor and a capacitor.

7. The acoustic wave device according to claim 1, wherein the first metal layer and the second metal layer are dummy bumps each being electrically independent from the acoustic wave element and the functional element.

8. The acoustic wave device according to claim 1, wherein the terminal is a ground terminal.

9. The acoustic wave device according to claim 1, wherein the second metal layer is separated from the functional element and a wiring line connected to the functional element in the second substrate.

10. An acoustic wave device comprising:
    a first substrate having a first surface;
    one or more first acoustic wave resonators located on the first surface and included in a first filter;
    one or more second acoustic wave resonators located on the first surface and included in a second filter having a passband different from a passband of the first filter;
    a second substrate having a second surface and a third surface, the second surface facing the first surface across an air gap, the third surface being an opposite surface of the second substrate from the second surface;
    a first metal layer that is separated from the one or more first acoustic wave resonators, the one or more second acoustic wave resonators, a wiring line connected to the one or more first acoustic wave resonators, and a wiring line connected to the one or more second acoustic wave resonators in the first substrate and connects the first surface and the second surface, an acoustic wave resonator closest to the first metal layer in plan view being at least one of the one or more first acoustic wave resonators;
    a second metal layer that is separated from the one or more first acoustic wave resonators, the one or more second acoustic wave resonators, the wiring line connected to the one or more first acoustic wave resonators, and the wiring line connected to the one or more second acoustic wave resonators in the first substrate and connects the first surface and the second surface, an acoustic wave resonator closest to the second metal layer in plan view being at least one of the one or more second acoustic wave resonators;

a first metal pattern that is located on the second surface, is in contact with the first metal layer and the second metal layer, and connects the first metal layer and the second metal layer; and a terminal that is located on the third surface and is electrically connectable to the first metal pattern.

11. The acoustic wave device according to claim 10, further comprising:

a second metal pattern located on the second surface and electrically connected to a ground pad of the first filter; and a third metal pattern located on the second surface and electrically connected to a ground pad of the second filter, wherein the first metal pattern is electrically independent from at least one of the second metal pattern and the third metal pattern in the second surface.

12. The acoustic wave device according to claim 10, wherein the terminal is a ground terminal.

13. The acoustic wave device according to claim 10, wherein the first metal layer and the second metal layer are dummy bumps electrically independent from the one or more first acoustic wave resonators and the one or more second acoustic wave resonators.

14. An acoustic wave device comprising:

a first substrate having a first surface;

an acoustic wave element located on the first surface;

a second substrate having a second surface;

a functional element located on the second surface;

a third substrate having a third surface and a fourth surface, the third surface facing the first surface and the second surface across an air gap, the fourth surface being an opposite surface of the third substrate from the third surface;

a first metal layer that is separated from the acoustic wave element and a wiring line connected to the acoustic wave element in the first substrate and connects the first surface and the third surface;

a second metal layer that is separated from the functional element and a wiring line connected to the functional element in the second substrate and connects the second surface and the third surface;

a first metal pattern that is located on the third surface, is in contact with the first metal layer and the second metal layer, and connects the first metal layer and the second metal layer;

a terminal that is located on the fourth surface and is electrically connectable to the first metal pattern;

a first insulating layer included in the third substrate and having the third surface;

a first via wiring being in contact with the first metal pattern between the first metal layer and the second metal layer and penetrating through the first insulating layer;

a second via wiring being in contact with the first metal pattern and penetrating through the first insulating layer;

a second insulating layer included in the third substrate, located between the first insulating layer and the fourth surface, and having a fifth surface; and a second metal pattern located on the fifth surface, connected to the terminal, and connected to the first metal pattern through the first via wiring and the second via wiring, the first via wiring and the second via wiring being connected in parallel to each other between the first metal pattern and the second metal pattern, wherein the first metal pattern is electrically connected to the terminal through the first via wiring.

15. The acoustic wave device according to claim 14, wherein:

the acoustic wave element includes one or more first acoustic wave resonators included in a first filter, and the functional element includes one or more second acoustic wave resonators included in a second filter having a passband different from a passband of the first filter.

16. The acoustic wave device according to claim 15, further comprising:

a third metal pattern located on the third surface and electrically connected to a ground pad of the first filter; and a fourth metal pattern located on the third surface and electrically connected to a ground pad of the second filter, wherein the first metal pattern is electrically independent from at least one of the third metal pattern and the fourth metal pattern in the third surface.

17. The acoustic wave device according to claim 14, wherein the first metal layer and the second metal layer are dummy bumps each being electrically independent from the acoustic wave element and the functional element.

18. The acoustic wave device according to claim 14, wherein the terminal is a ground terminal.

19. The acoustic wave device according to claim 14, wherein the functional element is at least one of an inductor and a capacitor.

* * * * *